(12) United States Patent
Hashimoto et al.

(10) Patent No.: US 11,189,459 B2
(45) Date of Patent: Nov. 30, 2021

(54) MULTIBEAM INSPECTION APPARATUS

(71) Applicant: NuFlare Technology, Inc., Yokohama (JP)

(72) Inventors: Hideaki Hashimoto, Yokohama (JP); Riki Ogawa, Kawasaki (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 16/886,872

(22) Filed: May 29, 2020

(65) Prior Publication Data
US 2020/0395191 A1 Dec. 17, 2020

(30) Foreign Application Priority Data

Jun. 14, 2019 (JP) .............................. JP2019-111579

(51) Int. Cl.
*H01J 37/28* (2006.01)
*H01J 37/065* (2006.01)
*H01J 37/063* (2006.01)

(52) U.S. Cl.
CPC ............ *H01J 37/28* (2013.01); *H01J 37/063* (2013.01); *H01J 37/065* (2013.01); *H01J 2237/2817* (2013.01)

(58) Field of Classification Search
CPC .......... H01J 37/00; H01J 37/02; H01J 37/063; H01J 37/065; H01J 37/22; H01J 37/222;
(Continued)

(56) References Cited

U.S. PATENT DOCUMENTS

2002/0036264 A1* 3/2002 Nakasuji ............... H01J 37/222
250/306
2016/0123898 A1* 5/2016 Chen .................. G01N 21/8851
356/237.5
(Continued)

FOREIGN PATENT DOCUMENTS

JP 2017-90063 A 5/2017
JP 2019-120654 A 7/2019

*Primary Examiner* — Jason L McCormack
(74) *Attorney, Agent, or Firm* — Oblon, McClelland, Maier & Neustadt, L.L.P.

(57) ABSTRACT

A pattern inspection apparatus according to an aspect described herein includes: a stage on which an object to be inspected is capable to be mounted, a multibeam column that irradiates the object to be inspected with multi-primary electron beams, and a multi-detector including a first detection pixel that receives irradiation of a first secondary electron beam emitted after a first beam scanning region of the object to be inspected is irradiated with a first primary electron beam of the multi-primary electron beams and a second detection pixel that receives irradiation of a second secondary electron beam emitted after a second beam scanning region adjacent to the first beam scanning region of the object to be inspected and overlapping with the first beam scanning region is irradiated with a second primary electron beam adjacent to the first primary electron beam of the multi-primary electron beams; a comparison unit that obtains a difference in beam intensity between the first primary electron beam and the second primary electron beam by comparing overlapping portions of a first frame image acquired through entering of the first secondary electron beam into the first detection pixel and a second frame image acquired through entering of the second secondary electron beam into the second detection pixel; and a sensitivity adjustor that adjusts detection sensitivity of the (Continued)

first detection pixel and/or the second detection pixel so as to correct the difference in beam intensity.

10 Claims, 13 Drawing Sheets

(58) Field of Classification Search
CPC ............... H01J 37/28; H01J 2237/2817; H01J 2237/0453; H01J 2237/2826
USPC .......................................... 250/306, 307, 311
See application file for complete search history.

(56) References Cited

U.S. PATENT DOCUMENTS

| | | |
|---|---|---|
| 2017/0125208 A1 | 5/2017 | Kikuiri et al. |
| 2019/0213726 A1 | 7/2019 | Hirano et al. |
| 2020/0027694 A1* | 1/2020 | Wang ....................... H01J 37/28 |

* cited by examiner

MULTIBEAM INSPECTION APPARATUS

CROSS-REFERENCE TO RELATED APPLICATION

This application is based upon and claims the benefit of priority from Japanese Patent Applications No. 2019-111579, filed on Jun. 14, 2019, the entire contents of which are incorporated herein by reference.

FIELD OF THE INVENTION

Embodiments described herein relate generally to a multibeam inspection apparatus. For example, the embodiments described herein relate to an inspection apparatus that acquires a secondary electron image of a pattern emitted through irradiation of a multibeam by an electron beam so as to inspect the pattern.

BACKGROUND OF THE INVENTION

In recent years, due to an increase in a degree of integration and a capacity of large scale integration (LSI), widths of circuit lines required for semiconductor elements have gotten narrower and narrower. These semiconductor elements are manufactured by circuit formation through transfer exposure of a pattern on a wafer by a reduction projection exposure apparatus, which is a so-called stepper, using an original pattern (also called a mask or a reticle. Hereinafter, collectively called a mask) in which a circuit pattern is formed.

For manufacturing LSI that requires a large manufacturing cost, it is indispensable to improve yield. A pattern that constitutes LSI is in a nanometer order. In recent years, due to miniaturization of a size of an LSI pattern formed on a semiconductor wafer, a size that needs to be detected as a pattern defect has been very small. Therefore, it is necessary to enhance the accuracy of a pattern inspection apparatus for inspecting a defect of an ultrafine pattern transferred on a semiconductor wafer. Other than that, as one of the major factors contributing to a decrease in the yield is a pattern defect of a mask used for exposure and transfer of an ultrafine pattern on a semiconductor wafer by a photolithography technique. Therefore, it is necessary to enhance the accuracy of a pattern inspection apparatus for inspecting a defect of a mask for transfer used for manufacturing LSI.

An inspection method that has been known is a method for performing an inspection through a comparison between an optical image obtained by capturing a pattern formed on a sample such as a semiconductor wafer or a lithography mask at a prescribed magnification using a magnifying optical system, and design data or an optical image obtained by capturing an identical pattern on the sample. Examples of the pattern inspection method include a "die to die inspection" that compares optical image data obtained by capturing identical patterns in different locations on the same mask, and a "die to database inspection" that generates design image data (reference image) simulating an optical image based on a computer-aided design (CAD) pattern format for a drawing apparatus, and then compares this design image data (reference data) with an optical image serving as measurement data obtained by capturing the pattern. In the inspection method of the inspection apparatus, a substrate to be inspected is placed on a stage and a luminous flux performs scanning on the sample as the stage moves so as to perform an inspection. The luminous flux is irradiated on the substrate to be inspected by a light source and an illumination optical system. An image of light that penetrates or is reflected by the substrate to be inspected is formed on a sensor via an optical system. The image captured by the sensor is sent to a comparison unit as measurement data. In the comparison unit, after positions of images are matched, the measurement data and reference data are compared with each other according to an appropriate algorithm. When matching does not succeed, it is determined that a pattern defect exists.

The pattern inspection apparatus described above acquires an optical image by irradiating the substrate to be inspected with a laser beam and capturing this transmitted image or reflected image. On the other hand, an inspection apparatus has been developed that irradiates a substrate to be inspected with a multibeam formed of a plurality of electron beams in an array in which a plurality of beam rows arrayed on a straight line at the same pitch is arranged, and detects a secondary electron corresponding to each beam emitted from the substrate to be inspected to acquire a pattern image. The pattern inspection apparatus using the electron beam including the multibeam detects the secondary electron by performing scanning for each small region of the substrate to be inspected. At this time, a so-called step and repeat operation is performed in which the position of the substrate to be inspected is fixed during beam scanning, and the position of the substrate to be inspected is moved to a next small region after the scanning ends. Through using of a multibeam in an array in which a plurality of beam rows arrayed on a straight line at the same pitch is arranged, multiple beams can be disposed in a limited region. This enables simultaneous scanning of multiple small regions at a time. As a result, improvement of throughput is expected.

In JP 2017-090063 A, it is described that in the pattern inspection apparatus of multibeam type, $n_1 \times m_1$ irradiation unit regions in a two-dimensional state in each image reference region are irradiated with a plurality of different beams of a multibeam.

SUMMARY OF THE INVENTION

A pattern inspection apparatus according to an aspect described herein includes: a stage on which an object to be inspected is capable to be mounted, a multibeam column that irradiates the object to be inspected with multi-primary electron beams, and a multi-detector including a first detection pixel that receives irradiation of a first secondary electron beam emitted after a first beam scanning region of the object to be inspected is irradiated with a first primary electron beam of the multi-primary electron beams and a second detection pixel that receives irradiation of a second secondary electron beam emitted after a second beam scanning region adjacent to the first beam scanning region of the object to be inspected and overlapping with a first scanning region is irradiated with a second primary electron beam adjacent to the first primary electron beam of the multi-primary electron beams; a comparison unit that obtains a difference in beam intensity between the first primary electron beam and the second primary electron beam by comparing overlapping portions of a first frame image acquired through entering of the first secondary electron beam into the first detection pixel and a second frame image acquired through entering of the second secondary electron beam into the second detection pixel; and a sensitivity adjustor that adjusts detection sensitivity of the first detection pixel and/or the second detection pixel so as to correct the difference in beam intensity.

DETAILED DESCRIPTION OF THE EMBODIMENTS

Hereinafter, embodiments described herein will be explained with reference to the drawings.

Hereinafter, in the embodiments, a case where an electron beam is used as an example of a charged particle beam will be explained. However, the charged particle beam is not limited thereto. Another charged particle beam such as an ion beam may be used.

A pattern inspection apparatus according to an aspect described herein includes: a stage on which an object to be inspected is capable to be mounted, a multibeam column that irradiates the object to be inspected with multi-primary electron beams, and a multi-detector including a first detection pixel that receives irradiation of a first secondary electron beam emitted after a first beam scanning region of the object to be inspected is irradiated with a first primary electron beam of the multi-primary electron beams and a second detection pixel that receives irradiation of a second secondary electron beam emitted after a second beam scanning region adjacent to the first beam scanning region of the object to be inspected and overlapping with the first beam scanning region is irradiated with a second primary electron beam adjacent to the first primary electron beam of the multi-primary electron beams; a comparison unit that obtains a difference in beam intensity between the first primary electron beam and the second primary electron beam by comparing overlapping portions of a first frame image acquired through entering of the first secondary electron beam into the first detection pixel and a second frame image acquired through entering of the second secondary electron beam into the second detection pixel; and a sensitivity adjustor that adjusts detection sensitivity of the first detection pixel and/or the second detection pixel so as to correct the difference in beam intensity.

First Embodiment

Figure 1:
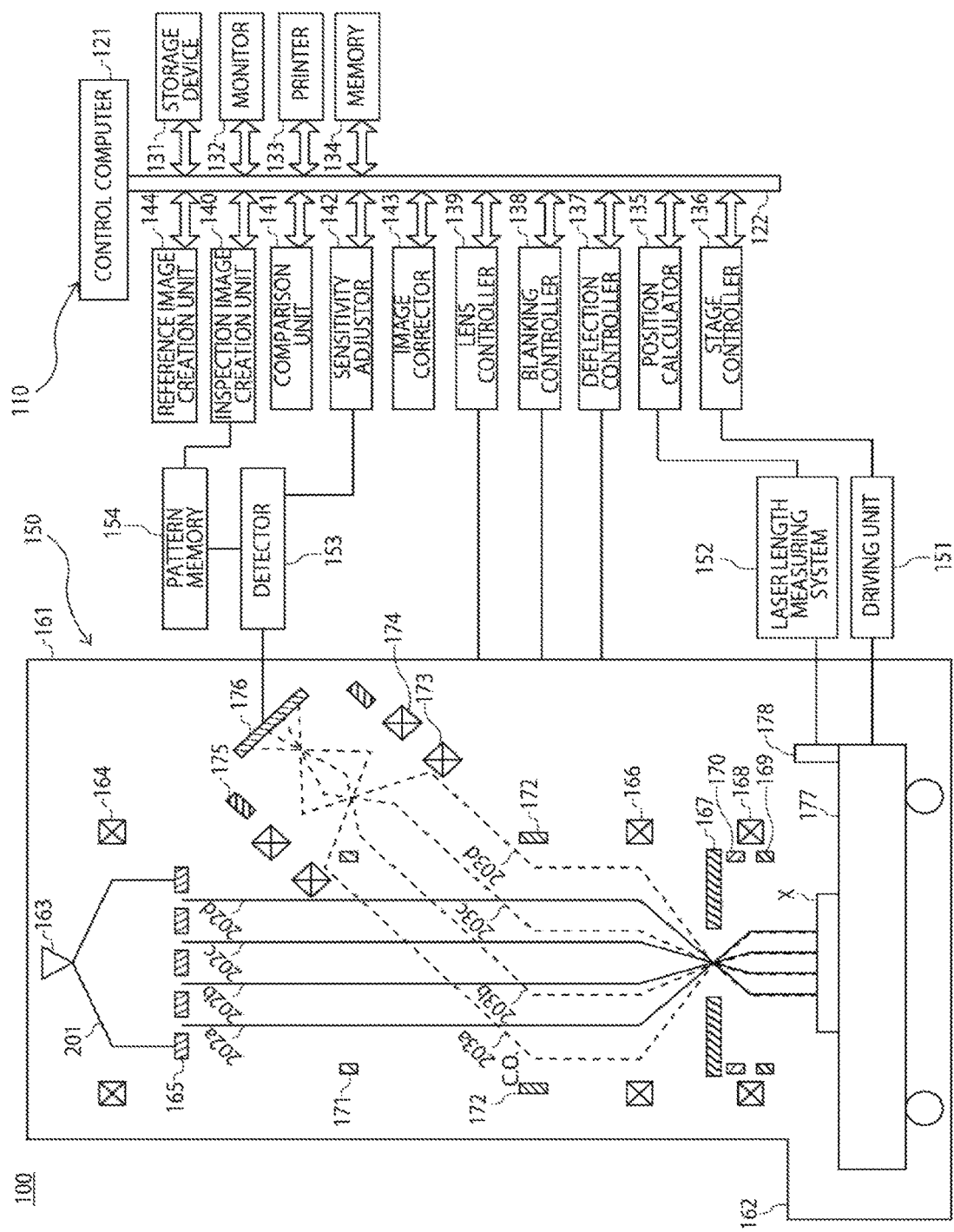
FIG. 1 is a configuration diagram showing a configuration of a multibeam inspection apparatus according to a first embodiment.

FIG. 1 is a configuration diagram showing a configuration of a pattern inspection apparatus according to a first embodiment. In FIG. 1, an inspection apparatus 100 that inspects a pattern formed on a substrate is one example of a charged particle beam inspection apparatus. The inspection apparatus 100 includes a controller 110 and an electronic-optical image acquisition mechanism 150. The controller 110 includes a control computer 121, a bus 122, a storage device 131, a monitor 132, a printer 133, a memory 134, a position calculator 135, a stage controller 136, a deflection controller 137, a blanking controller 138, a lens controller 139, an inspection image creation unit 140, a comparison unit 141, a sensitivity adjustor 142, an image corrector 143, and a reference image creation unit 144. The electronic-optical image acquisition mechanism 150 includes a driving unit 151, a laser length measuring system 152, a detector 153, a pattern memory 154, an electron beam column 161 (electronic lens barrel), and an inspection chamber 162. In the electron beam column 161, an electron gun 163, an illumination lens 164, a shaping aperture array substrate 165, a reducing lens 166, a limit aperture substrate 167, an objective lens 168, a main deflector 169, a sub-reflector 170, a collectively blanking deflector 171, a beam separator 172, a projection lens 173, a projection lens 174, a deflector 175, and a multi-detector 176 are disposed.

In the inspection chamber 162, for example, a stage 177 and a mirror 178 capable of moving on an xy plane are disposed. On the stage 177, an object to be inspected including a region to be inspected X is disposed. Examples of the object to be inspected include a semiconductor substrate, a chip in which a pattern is formed, and a mask for forming a pattern. The object to be inspected X is disposed with a pattern formation surface facing upward on the stage 177. Moreover, on the stage 177, the mirror 178 is disposed that reflects a laser beam for measuring a length of laser irradiated from the laser length measuring system 152 disposed outside the inspection chamber 162.

The multi-detector 176 is connected to the detector 153 outside the electron beam column 161. The detector 153 is connected to the pattern memory 154.

In the controller 110, the control computer 121 that serves as a computer is connected to the storage device 131, the monitor 132, the printer 133, the memory 134, the position calculator 135, the stage controller 136, the deflection controller 137, the blanking controller 138, the lens controller 139, the inspection image creation unit 140, the comparison unit 141, the sensitivity adjustor 142, the image corrector 143, and the reference image creation unit 144 through the bus 122. Moreover, the pattern memory 154 is connected to the inspection image creation unit 140.

In the stage 177, the stage controller 136 controls the driving unit 151. The driving unit 151 controlled by the stage controller 136 moves the position of the stage 177. The driving unit 151 is configured by driving systems such as motors of three axes (x-y-θ) that cause driving in an x-direction, a y-direction, and a θ direction. These driving systems enable the stage 177 to move in an arbitrary direction. For these x-motor, y-motor, and θ-motor, which are not shown, a step motor can be used, for example. The stage 177 can move in a horizontal direction and a rotation direction by the motor of each of x-, y- and θ-axes. A moving position of the stage 177 is measured by the laser length measuring system 152 and provided to the position calculator 135, and positions of the stage 177 and the region to be inspected X are calculated. The laser length measuring system 152 measures the position of the stage 177 according to the principle of laser interferometry by receiving reflection light from the mirror 178, for example.

A high-voltage power supply circuit, which is not shown, is connected to the electron gun 163. Together with application of acceleration voltage between a filament and an extraction electrode, which are not shown, in the electron gun 163 from the high-voltage supply circuit, application of voltage of a prescribed extraction electrode and heating of a cathode (filament) at a prescribed temperature cause acceleration of an electron group emitted from the cathode, followed by emission as electron beams. For example, an electromagnetic lens is used for the illumination lens 164, the reducing lens 166, the objective lens 168, the projection lens 173, and the projection lens 174, and the lens controller 139 controls these lenses. Moreover, the lens controller 139 also controls the beam separator 172. The collectively blanking deflector 171 and the deflector 175 are each configured by an electrode group having at least two electrodes, and controlled by the blanking controller 138. The main deflector 169 and the sub-reflector 170 are each configured by an electrode group having at least four electrodes, and controlled by the deflection controller 137.

When the region to be inspected X is a semiconductor wafer in which a plurality of chip (die) patterns is formed, pattern data of the chip (die) patterns is input from the outside of the inspection apparatus 100 and stored in the storage device 131. When the region to be inspected X is a mask for exposure, design pattern data based on which a mask pattern is formed on the mask for exposure is input from the outside of the inspection apparatus 100 and stored in the storage device 131.

Here, in FIG. 1, a configuration necessary for explanation of the first embodiment is described. Other configurations normally necessary for the inspection apparatus 100 may be included.

Figure 2:
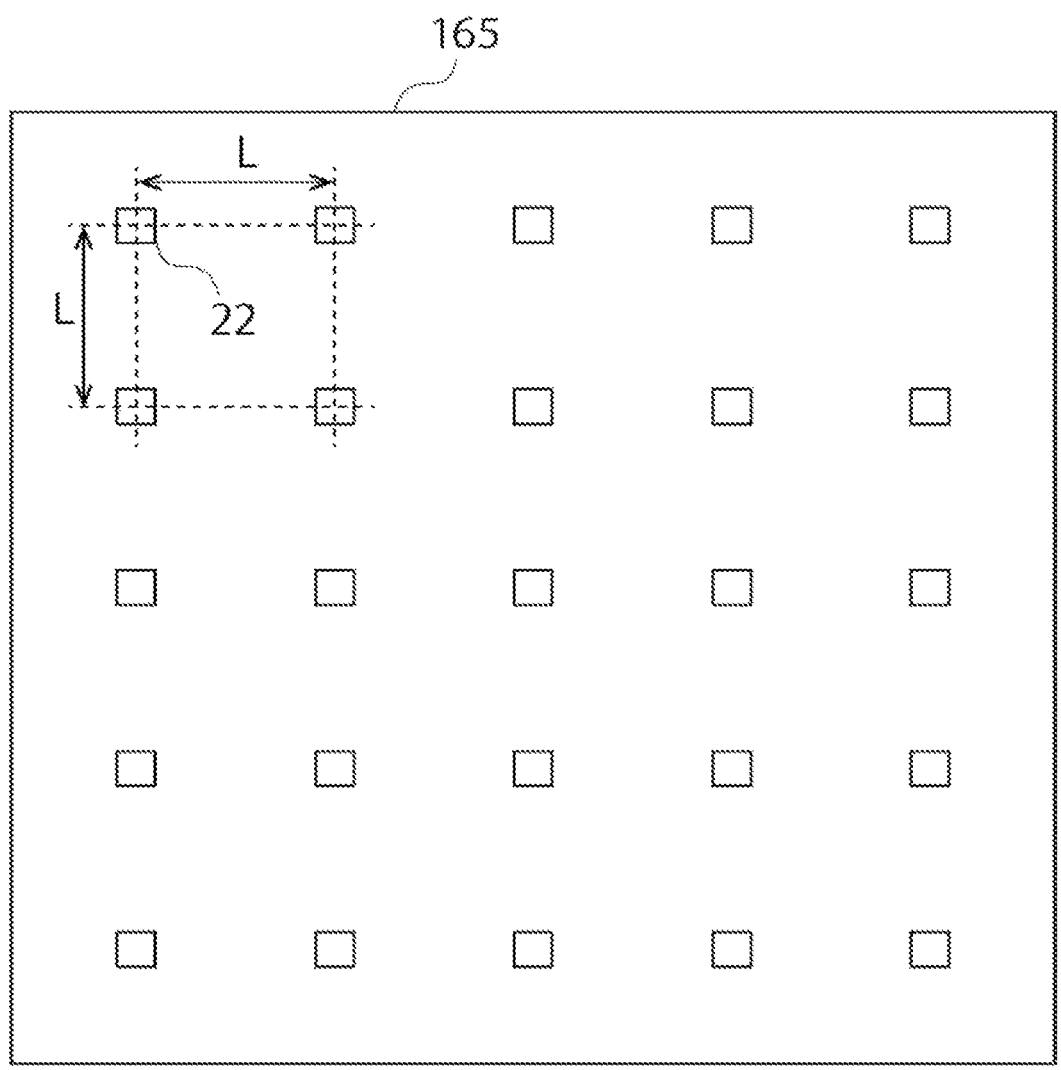
FIG. 2 is a schematic view showing a configuration of a shaping aperture array substrate according to the first embodiment.

FIG. 2 is a schematic view showing a configuration of a shaping aperture array substrate 165 according to the first embodiment. In FIG. 2, in the shaping aperture array substrate 165, holes (openings) A in M horizontal rows (x-direction)×M' vertical steps (y-direction) in a two-dimensional state (matrix), where M is an integer of 2 or larger, and M' is an integer of 1 or larger, are formed at a prescribed array pitch L in an x-direction and a y-direction (x: a first direction, y: a second direction). Note that when a reduction magnification of the multibeam is A (when a diameter of the multibeam is reduced to 1/A to irradiate the region to be inspected X), and a pitch between beams of the multibeam with respect to the x- and y-directions on a sample 101 is p, the array pitch L satisfies a relation of L=(A×p). The example of FIG. 2 shows a case where holes 22 are formed for forming 5×5 beams of the multibeam, where M is 5 and M' is 5. Next, an operation of the electronic-optical image acquisition mechanism 150 in the inspection apparatus 100 will be explained.

An electron beam 201 emitted from the electron gun 163 (emission source) substantially vertically illuminates the entire shaping aperture array substrate 165 by the illumination lens 164. In the shaping aperture array substrate 165, as shown in FIG. 2, a plurality of holes 22 (openings) having a rectangular shape is formed, and the electron beam 201 illuminates a region including all of the plurality of holes 22. Since each part of the electron beam 201 irradiated in a position of the plurality of holes 22 passes through each of the plurality of holes 22 of the shaping aperture array substrate 165, for example, a plurality of electron beams (multibeam) 202a, 202b, 202c, and 202d having a rectangular shape (solid lines in FIG. 1) (multi-primary electron beams) is formed.

After passing through the beam separator 172, the formed multi-primary electron beams 202a to 202d are reduced by the reducing lens 166, and travel toward a center hole formed in the limit aperture substrate 167. Here, when the entire multi-primary electron beams 202a to 202d have been collectively deflected by the collectively blanking deflector 171 disposed between the shaping aperture array substrate 165 and the reducing lens 166, the multi-primary electron beams 202a to 202d positionally deviate from the center hole of the limit aperture substrate 167, and are shielded by the limit aperture substrate 167. On the other hand, the multi-primary electron beams 202a to 202d that have not been deflected by the collectively blanking deflector 171 pass through the center hole of the limit aperture substrate 167 as shown in FIG. 1. According to an on/off state of the collectively blanking deflector 171, blanking is controlled and the on/off state of the beams are collectively controlled. In this way, the limit aperture substrate 167 shields the multi-primary electron beams 202a to 202d that have been deflected by the collectively blanking deflector 171 to enter the beam-off state A beam group that have been formed from the beam-on state to the beam-off state and passed through the limit aperture substrate 167 forms the multi-primary electron beams 202a to 202d for inspection.

The multi-primary electron beams 202a to 202d that have passed through the limit aperture substrate 167 are focused on a surface of the region to be inspected X by the objective lens 168, become pattern images (beam diameter) having a desired reduction rate. The entire multi-primary electron beams 202 that have passed through the limit aperture substrate 167 are collectively deflected in the same direction by the main deflector 169 and the sub-reflector 170, and irradiated in a respective irradiation position on the region to be inspected X of each beam. In this case, the main deflector 169 collectively deflects the entire multi-primary electron beams 202 in reference positions of the region to be inspected X to be scanned by the multi-primary electron beams 202.

In the first embodiment, for example, scanning is performed while the stage 177 is continuously moved. Therefore, the main deflector 169 performs tracking deflection so as to follow the movement of the stage 177. Then, the sub-reflector 170 collectively deflects the entire multi-primary electron beams 202 so that each beam performs scanning in a region that each beam corresponds to. The multi-primary electron beams 202 irradiated at one time are arranged ideally at a pitch obtained through multiplying of an array pitch of the plurality of holes 22 of the shaping aperture array substrate 165 by the desired reduction rate (1/A) described above. In this way, the electron beam column 161 irradiates the region to be inspected X with $m_1 \times n_1$ beams of the multi-primary electron beams 202 in the two-dimensional state at a time. As a result of irradiation of the multi-primary electron beams 202 in desired positions of the region to be inspected X, a flux of secondary electrons (multi-secondary electron beams 203a, 203b, 203c, and 203d) (broken lines in FIG. 1) is emitted from the region to be inspected X, the flux of secondary electrons corresponding to each beam of the multi-primary electron beams 202 and including reflection electrons.

Multi-secondary electron beams 203 emitted from the region to be inspected X are refracted by the objective lens 168 on a side of a center of the multi-secondary electron beams 203, and travel toward the center hole formed in the limit aperture substrate 167. The multi-secondary electron beams 203 that have passed the limit aperture substrate 167 are refracted by the reducing lens 166 in substantially parallel to an optical axis, and travel toward the beam separator 172.

Here, the beam separator 172 generates an electric field and a magnetic field in an orthogonal direction on a surface orthogonal to a direction (optical axis) toward which the multi-primary electron beams 202 travel. The electric field exerts a force in the same direction regardless of a travelling direction of electrons. On the other hand, the magnetic field exerts a force according to the Fleming's left-hand rule. Accordingly, a direction of a force applied to the electrons can be changed by an entry direction of the electrons. For the multi-primary electron beams 202 (primary electron beams) that enter the beam separator 172 from above, the force by the electric field and the force by the magnetic field cancel each other, and the multi-primary electron beams 202 move straight down. On the other hand, for the multi-secondary electron beams 203 that enter the beam separator 172 from below, the force by the electric field and the force by the magnetic field both work in the same direction, and the multi-secondary electron beams 203 are bent obliquely upward.

The multi-secondary electron beams 203 bent obliquely upward are projected onto the multi-detector 176 while being refracted by the projection lens 173 and the projection lens 174. The multi-detector 176 detects the projected multi-secondary electron beams 203. The multi-detector 176 includes a plurality of detection pixels. The multi-detector 176 includes, for example, a two-dimensional sensor of diode type, which is not shown. Then, in a position of the two-dimensional sensor of diode type corresponding to each beam of the multi-secondary electron beams 203, each secondary electron of the multi-secondary electron beams 203 collides with the two-dimensional sensor of diode type, generates electrons, and generates secondary electron image data for each pixel described later. Moreover, scanning is performed while the stage 177 is continuously moved, the tracking deflection is performed as described above. In response to the movement of the deflection position associated with the tracking deflection, the deflector 175 deflects the multi-secondary electron beams 203 so as to irradiate a desired position on a light-receiving surface of the multi-detector 176.

Figure 3:
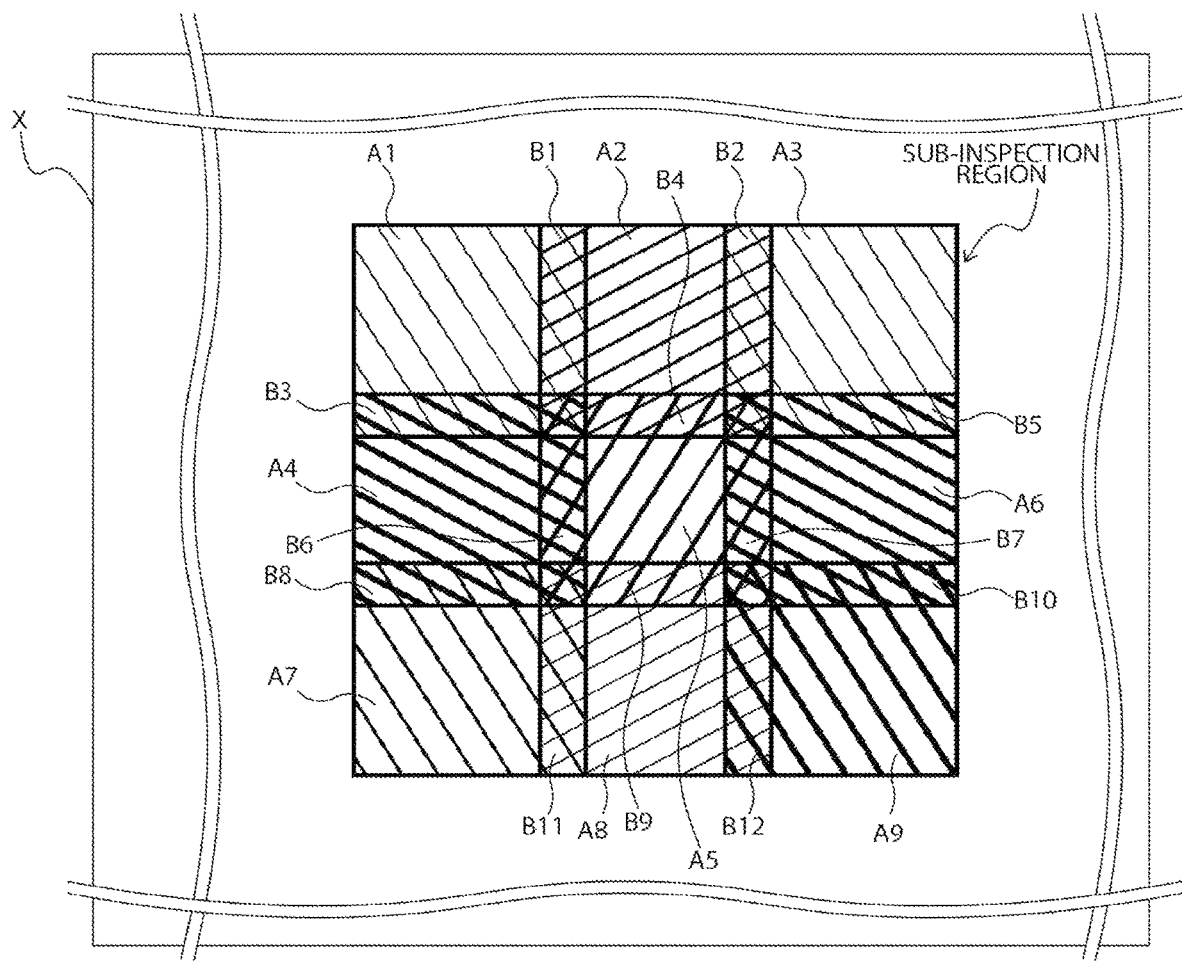
FIG. 3 is a schematic view showing a first beam scanning region A1, a second beam scanning region A2, a third beam scanning region A3, a fourth beam scanning region A4, a fifth beam scanning region A5, a sixth beam scanning region A6, a seventh beam scanning region A7, an eighth beam scanning region A8, and a ninth beam scanning region A9 according to the first embodiment.

FIG. 3 is a schematic view describing a first beam scanning region A1, a second beam scanning region A2, a third beam scanning region A3, a fourth beam scanning region A4, a fifth beam scanning region A5, a sixth beam scanning region A6, a seventh beam scanning region A7, an eighth beam scanning region A8, and a ninth beam scanning region A9 according to the embodiment. FIG. 3 shows regions to be scanned by the multi-primary electron beams 202 in the region to be inspected X. For example, when the region to be inspected X is inspected by nine beams of the multi-primary electron beams 202 in 3×3, a process for inspecting a sub-inspection region including 3×3 scanning regions is performed a plurality of times so as to inspect the entire region to be inspected X. In the embodiment, for the sake of convenience, the nine scanning regions are shown and explained. Therefore, FIG. 4 also shows nine output images C1 to C9 corresponding to scanning regions A1 to A9. These are examples, and the number of holes 22, the number of multi-primary electron beams 202, the number of scanning regions, the number of pixels of the multi-detector 176, and the like are not limited thereto.

FIG. 3 shows the scanning regions A1 to A9 of the multi-primary electron beams 202 and overlapping regions B1 to B12 of the scanning regions A1 to A9 in the region to be inspected X. An region occupied by the first to ninth beam scanning regions A1 to A9 are a part of the region to be inspected X. Each scanning region is distinguished by a hatching pattern. A part in which hatching patterns overlap with each other is a region in which scanning regions overlap with each other. An n-th primary electron beam, which is one beam of the multi-primary electron beams 202, is defined as the n-th primary electron beam 202. The area to be scanned by the first primary electron beam 202 is the first beam scanning region A1. The area to be scanned by the second primary electron beam 202 is the second beam scanning region A2. The area to be scanned by the third primary electron beam 202 is the third beam scanning region A3. The area to be scanned by the fourth primary electron beam 202 is the fourth beam scanning region A4. The area to be scanned by the fifth primary electron beam 202 is the fifth beam scanning region A5. The area to be scanned by the sixth primary electron beam 202 is the sixth beam scanning region A6. The area to be scanned by the seventh primary electron beam 202 is the seventh beam scanning region A7. The area to be scanned by the eighth primary electron beam 202 is the eighth beam scanning region A8. The area to be scanned by the ninth primary electron beam 202 is the ninth beam scanning region A9.

The first primary electron beam 202 is adjacent to the second primary electron beam 202, the fourth primary electron beam 202, and the fifth primary electron beam 202. The second primary electron beam 202 is adjacent to the first primary electron beam 202, the third primary electron beam 202, the fourth primary electron beam 202, the fifth primary electron beam 202, and the sixth primary electron beam 202. The third primary electron beam 202 is adjacent to the second primary electron beam 202, the fifth primary electron beam 202, and the sixth primary electron beam 202. The fourth primary electron beam 202 is adjacent to the first primary electron beam 202, the second primary electron beam 202, the fifth primary electron beam 202, the seventh primary electron beam 202, and the eighth primary electron beam 202. The fifth primary electron beam 202 is adjacent to the first primary electron beam 202, the second primary electron beam 202, the third primary electron beam 202, the fourth primary electron beam 202, the sixth primary electron beam 202, the seventh primary electron beam 202, the eighth primary electron beam 202, and the ninth primary electron beam 202. The sixth primary electron beam 202 is adjacent to the second primary electron beam 202, the third primary electron beam 202, the fifth primary electron beam 202, the eighth primary electron beam 202, and the ninth primary electron beam 202. The seventh primary electron beam 202 is adjacent to the fourth primary electron beam 202, the fifth primary electron beam 202, and the eighth primary electron beam 202. The eighth primary electron beam 202 is adjacent to the fourth primary electron beam 202, the fifth primary electron beam 202, the sixth primary electron beam 202, the seventh primary electron beam 202, and the ninth primary electron beam 202. The ninth primary electron beam 202 is adjacent to the fifth primary electron beam 202, the sixth primary electron beam 202, and the eighth primary electron beam 202.

A positional relation of the adjacent primary electron beams 202 corresponds to a positional relation of the adjacent scanning regions each of which is to be scanned by each beam. Numbers of the beams also correspond to numbers of the scanning regions. For example, the first beam scanning region A1 is adjacent to the second beam scanning region A2, the fourth beam scanning region A4, and the fifth beam scanning region A5.

Figure 5:
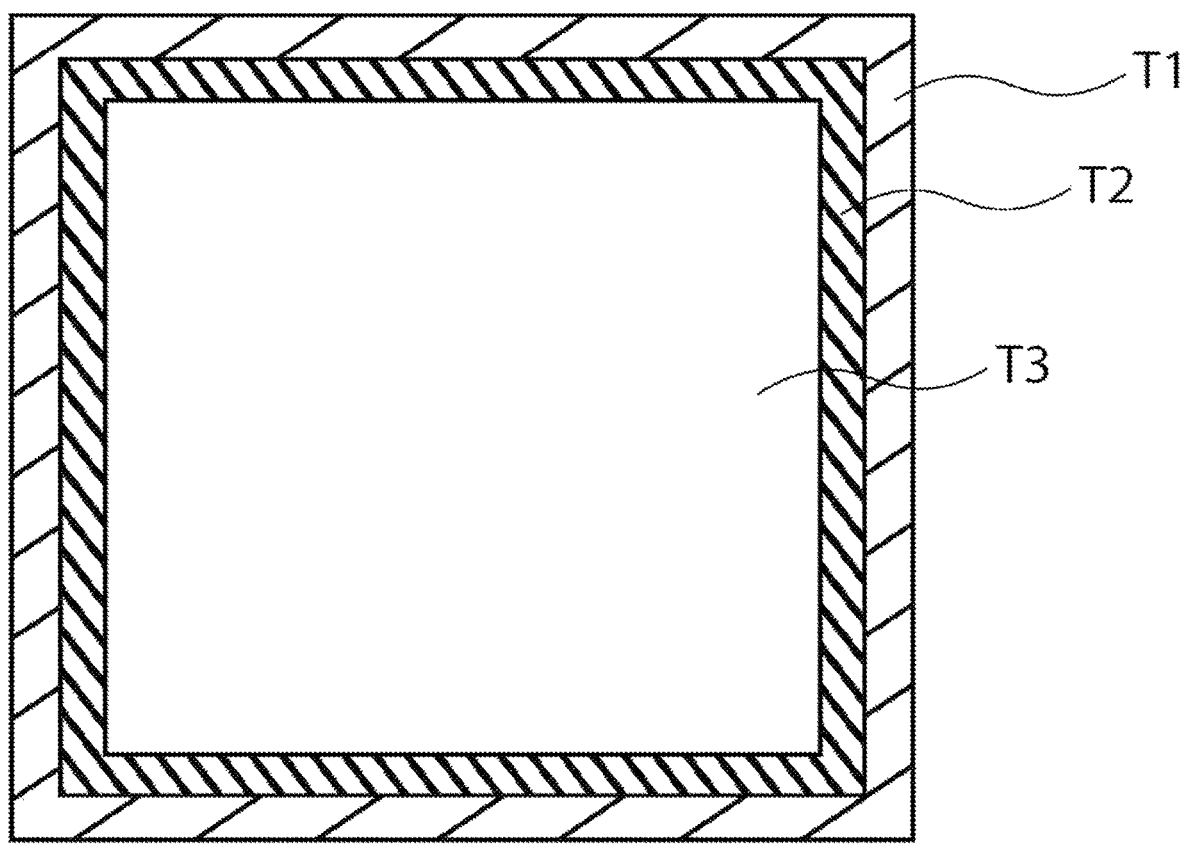
FIG. 5 is a schematic view showing a position deviation compensation area, a non-effective region portion caused by image processing, and an effective region of one beam scanning region according to the first embodiment.
Figure 6:
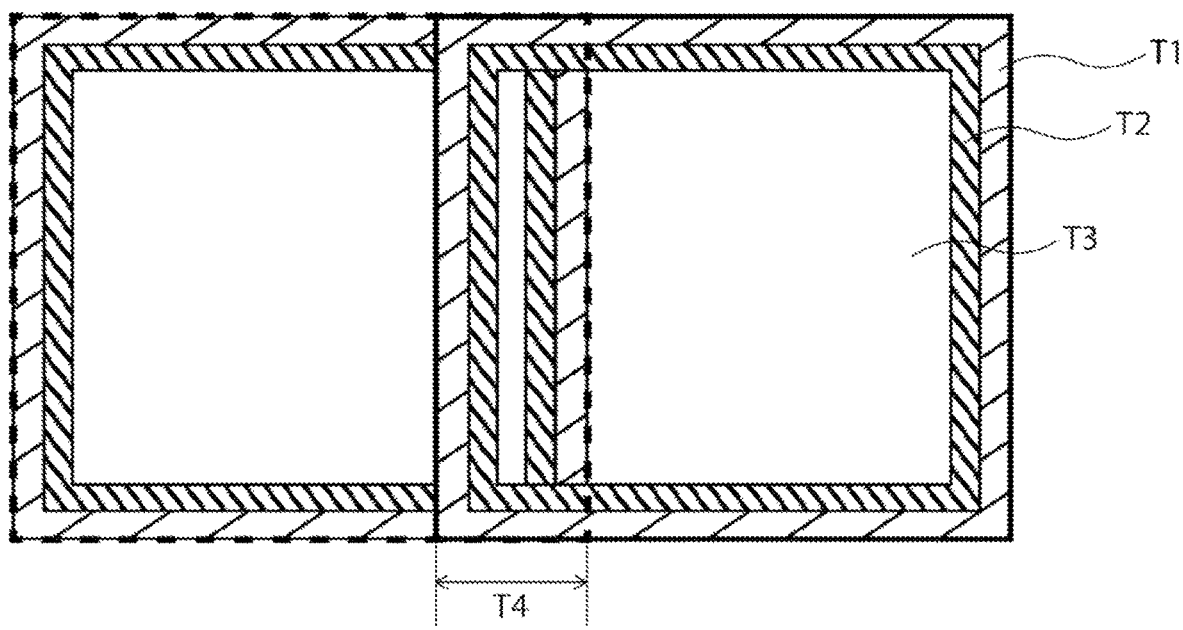
FIG. 6 is a schematic view showing a width overlapping with an adjacent inspection area according to the first embodiment.

In order to prevent omission of an inspection area, when a position deviation of each beam scanning region caused by apparatus performance is taken into consideration, and in addition, output images corresponding to the respective beams are treated with image processing using peripheral pixels such as blur processing, an non-effective region according to calculation processing is generated in an image end portion. Therefore, it is necessary to add the amount of the non-effective region as needed and set the scanning regions to be scanned by the adjacent primary electron beams 202 so as to overlap with the scanning regions of the electron beams having the adjacency relation explained earlier. FIG. 5 is a view schematically showing a position deviation compensation area T1, a non-effective region portion T2 caused by image processing, and an effective region T3 of one beam scanning region. FIG. 6 schematically shows a width overlapping with an adjacent inspection area. As shown in FIG. 6, a width T4 overlapping with the adjacent inspection area needs to be set to $$T4 > (\text{width of } T1 + \text{width of } T2) \times 2$$

so as to overlap with an inspection effective region of the adjacent area.

An overlapping scanning region B1 is a region in which the first beam scanning region A1 and the second beam scanning region A2 adjacent to the first beam scanning region A1 overlap with each other. An overlapping scanning region B2 is a region in which the second beam scanning region A2 and the third beam scanning region A3 adjacent to the second beam scanning region A2 overlap with each other. An overlapping scanning region B3 is a region in which the first beam scanning region A1 and the fourth beam scanning region A4 adjacent to the first beam scanning region A1 overlap with each other. An overlapping scanning region B4 is a region in which the second beam scanning region A2 and the fifth beam scanning region A5 adjacent to the second beam scanning region A2 overlap with each other. An overlapping scanning region B5 is a region in which the third beam scanning region A3 and the sixth beam scanning region A6 adjacent to the third beam scanning region A3 overlap with each other. An overlapping scanning region B6 is a region in which the fourth beam scanning region A4 and the fifth beam scanning region A5 adjacent to the fourth beam scanning region A4 overlap with each other. An overlapping scanning region B7 is a region in which the fifth beam scanning region A5 and the sixth beam scanning region A6 adjacent to the fifth beam scanning region A5 overlap with each other. An overlapping scanning region B8 is a region in which the fourth beam scanning region A4 and the seventh beam scanning region A7 adjacent to the fourth beam scanning region A4 overlap with each other. An overlapping scanning region B9 is a region in which the fifth beam scanning region A5 and the eighth beam scanning region A8 adjacent to the fifth beam scanning region A5 overlap with each other. An overlapping scanning region B10 is a region in which the sixth beam scanning region A6 and the ninth beam scanning region A9 adjacent to the sixth beam scanning region A6 overlap with each other. An overlapping scanning region B11 is a region in which the seventh beam scanning region A7 and the eighth beam scanning region A8 adjacent to the seventh beam scanning region A7 overlap with each other. An overlapping scanning region B12 is a region in which the eighth beam scanning region A8 and the ninth beam scanning region A9 adjacent to the eighth beam scanning region A8 overlap with each other. Note that, for example, the overlapping scanning region B1 also includes a region in which the first beam scanning region A1 and the fifth beam scanning region A5 overlap with each other (a region in which four overlapping regions, which are the overlapping region B1, the overlapping region B3, the overlapping region B4, and the overlapping region B6, overlap with each other).

Hereinafter, an image processing unit of an image acquired by a secondary electron beam output through electron beam scanning in the apparatus is called a frame. A size of the frame may be processed after being divided into a plurality of parts within an output image from each electron beam scanning region. Regarding a necessary overlapping amount of the adjacent electron beam scanning regions explained above, even if the size of the frame is divided into the plurality of parts in each electron beam scanning region, the width of a non-effective region generated by image processing in the end portion of the beam scanning region is the same, and thus for convenience of explanation of examples, an explanation will be given assuming that the size of the output image acquired from each electron beam scanning region matches one frame image in the image processing unit.

Figure 4:
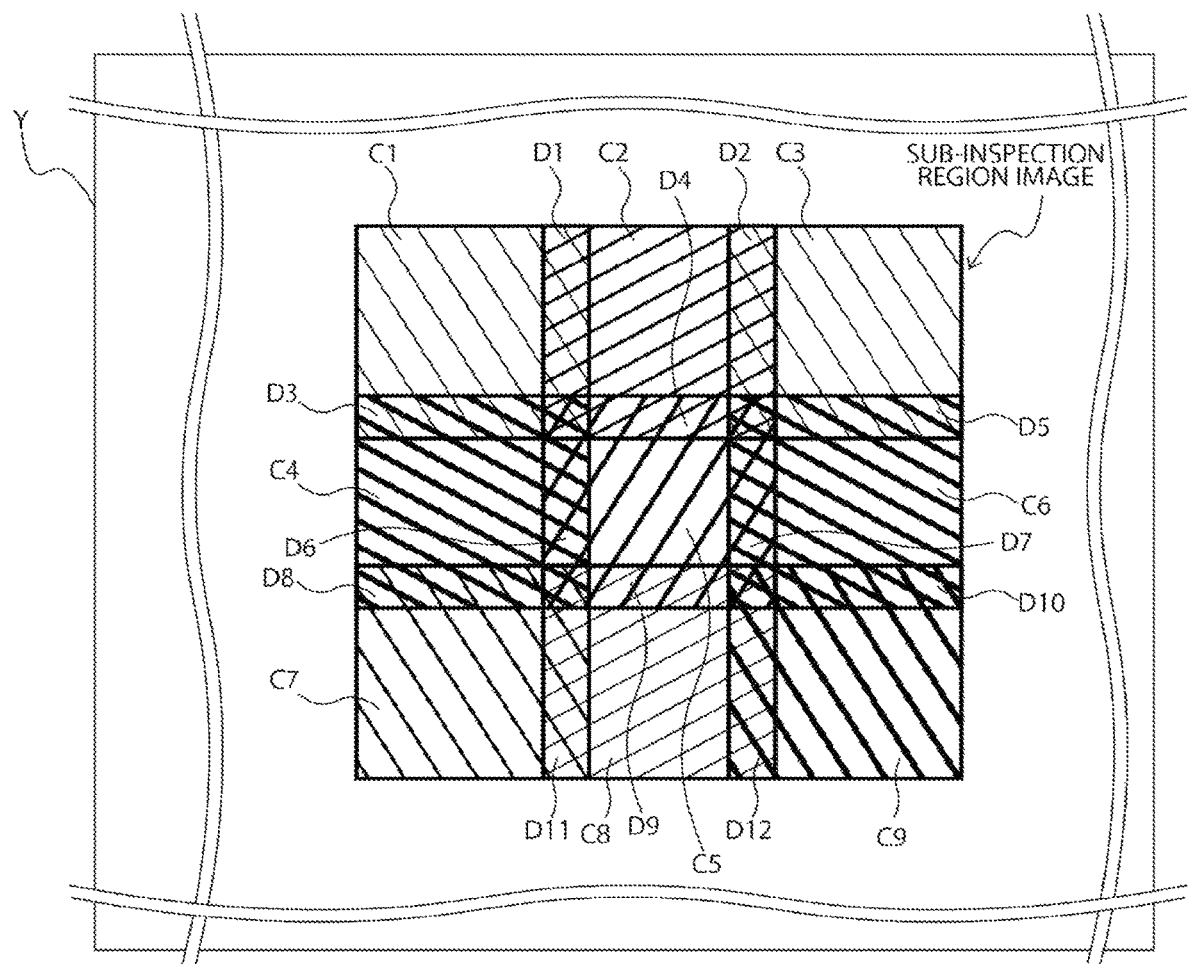
FIG. 4 is a schematic view showing a first frame image C1, a second frame image C2, a third frame image C3, a fourth frame image C4, a fifth frame image C5, a sixth frame image C6, a seventh frame image C7, an eighth frame image C8, and a ninth frame image C9 according to the first embodiment.

FIG. 4 is a schematic view for explaining a first frame image C1, a second frame image C2, a third frame image C3, a fourth frame image C4, a fifth frame image C5, a sixth frame image C6, a seventh frame image C7, an eighth frame image C8, and a ninth frame image C9 according to the embodiment. A sub-inspection region image is acquired through joining of vertical 3 frame images×horizontal 3 frame images so that the frame images partially overlap with each other. An inspection region image Y can be acquired through further overlapping and joining of the sub-inspection region images. When the number of sub-inspection region is one, the sub-inspection region image serves as the inspection region image Y. FIG. 4 shows a region of the inspection region image Y acquired from the secondary electron beam 203 emitted from each scanning region of the region to be inspected X. Numbers of the scanning regions correspond to numbers of the frame images.

Through irradiation of the region to be inspected X with the multi-primary electron beams 202, the multi-secondary electron beams 203 emitted from the region to be inspected X enter the multi-detector 176 as described above. The multi-secondary electron beams 203 emitted through illumination of each scanning region (for example, scanning regions A1 to A9 in FIG. 3) each enters a different pixel in the multi-detector 176. Based on data of intensity and an inspection position of the secondary electron beam 203 that has entered each pixel and, the frame image of each scanning region is created. Note that the first detection pixel may be one detection pixel, or may be formed of a plurality of sub-pixels disposed in a two-dimensional state.

FIG. 4 shows the frame images C1 to C9 created from each of the multi-secondary electron beams 203 within the inspection region image Y, first to twelfth overlapping frame image regions D1 to D12 of the frame images C1 to C9. A signal of the secondary electron beam 203 entering the multi-detector 176 is processed in the detector 153. For example, an analogue signal input into the detector 153 is converted into a digital signal. Processing such as amplifying can be performed before and after conversion of a signal. The digital signal generated by the processing in the detector 153 is temporarily stored in the pattern memory 154, and a frame image necessary for an inspection is created from data stored in the pattern memory 154 in the inspection image creation unit 140.

The first secondary electron beam 203 emitted from the first scanning region A1 enters a first detection pixel of the multi-detector 176 so as to acquire the first frame image C1. Moreover, the second secondary electron beam 203 adjacent to the first secondary electron beam 203 enters a second detection pixel adjacent to the first detection pixel of the multi-detector 176 so as to acquire the second frame image C2. Moreover, the third secondary electron beam 203 adjacent to the second secondary electron beam 203 enters a third detection pixel adjacent to the second detection pixel of the multi-detector 176 so as to acquire the third frame image C3. Moreover, the fourth secondary electron beam 203 adjacent to the first secondary electron beam 203 enters a fourth detection pixel adjacent to the first detection pixel of the multi-detector 176 so as to acquire the fourth frame image C4. Moreover, the fifth secondary electron beam 203 adjacent to the fourth secondary electron beam 203 enters a fifth detection pixel adjacent to the fourth detection pixel of the multi-detector 176 so as to acquire the fifth frame image C5. Moreover, the sixth secondary electron beam 203 adjacent to the fifth secondary electron beam 203 enters a sixth detection pixel adjacent to the fifth detection pixel of the multi-detector 176 so as to acquire the sixth frame image C6. Moreover, the seventh secondary electron beam 203 adjacent to the fourth secondary electron beam 203 enters a seventh detection pixel adjacent to the fourth detection pixel of the multi-detector 176 so as to acquire the seventh frame image C7. Moreover, the eighth secondary electron beam 203 adjacent to the seventh secondary electron beam 203 enters an eighth detection pixel adjacent to the seventh detection pixel of the multi-detector 176 so as to acquire the eighth frame image C8. Moreover, the ninth secondary electron beam 203 adjacent to the eighth secondary electron beam 203 enters a ninth detection pixel adjacent to the eighth detection pixel of the multi-detector 176 so as to acquire the ninth frame image C9.

The acquired frame images C1 to C9 have regions overlapping with the adjacent frame images. The first overlapping frame image region D1 is a region in which the first frame image C1 and the second frame image C2 overlap with each other. The second overlapping frame image region D2 is a region in which the second frame image C2 and the third frame image C3 overlap with each other. The third overlapping frame image region D3 is a region in which the first frame image C1 and the fourth frame image C4 overlap with each other. The fourth overlapping frame image region D4 is a region in which the second frame image C2 and the fifth frame image C5 overlap with each other. The fifth overlapping frame image region D5 is a region in which the third frame image C3 and the sixth frame image C6 overlap with each other. The sixth overlapping frame image region D6 is a region in which the fourth frame image C4 and the fifth frame image C5 overlap with each other. The seventh overlapping frame image region D7 is a region in which the fifth frame image C5 and the sixth frame image C6 overlap with each other. The eighth overlapping frame image region D8 is a region in which the fourth frame image C4 and the seventh frame image C7 overlap with each other. The ninth overlapping frame image region D9 is a region in which the fifth frame image C5 and the eighth frame image C8 overlap with each other. The tenth overlapping frame image region D10 is a region in which the sixth frame image C6 and the ninth frame image C9 overlap with each other. The eleventh overlapping frame image region D11 is a region in which the seventh frame image C7 and the eighth frame image C8 overlap with each other. The twelfth overlapping frame image region D12 is a region in which the eighth frame image C8 and the ninth frame image C9 overlap with each other. Note that for example, the overlapping frame image region D1 also includes a region in which the first frame image C1 and the fifth frame image C5 overlap with each other (a region in which four overlapping regions, which are the overlapping frame image region D1, the overlapping frame image region D3, the overlapping frame image region D4, and the overlapping frame image region D6, overlap with each other).

The comparison unit 141 compares a reference frame image generated in a reference image creation unit 144 with an inspection frame image generated in an inspection image creation unit 140 (and obtain a difference), and detects a defect from a result of the comparison. At time of inspection, beam characteristics are calibrated before the inspection so that the difference result in the comparison unit 141 does not include a difference in beam characteristics. When a reference frame image is created in the reference image creation unit, a reference frame image in which the advance calibration result is incorporated is generated, or a correction frame image in which the calibration result is incorporated is generated in the detector 153 to reduce the difference by the beam characteristics, and thus only a defective part becomes a large difference signal and defect detection sensitivity is improved.

When a change occurs in the beam characteristics due to some causes (such as temperature drift) during an inspection, the change appears as a luminance change of an inspection frame image. However, in image processing of a defect detection operation, the change becomes a change in an offset amount of a difference with the reference frame image. Therefore, when correction of an offset amount between images (correction by a luminance average value), which is generally known, is performed in the image processing, a large change in the defect detection sensitivity does not appear, as a result of which this change in the beam characteristics will be missed.

Therefore, in the comparison unit 141 of the embodiment monitors a change (for example, luminance average value) in a portion overlapping with an adjacent frame image. When there is no change in the intensity of the multi-primary electron beams 202 during an inspection, for example, the overlapping frame image region D1 in the first frame image C1 and the overlapping frame image region D1 of the second frame image C2 are the same image or images having substantially no difference. However, when there is a change in the intensity of the first primary electron beam 202 and/or the intensity of the second primary electron beam 202, the difference between the first frame image C1 in the overlapping frame image region D1 and the second frame image C2 in the overlapping frame image region D1 increases. Since the same region is monitored by the primary electron beams 202 different from each other using a different detection pixel, a change between adjacent beams of the multi-primary electron beams 202 can be detected.

When a change between the multi-primary electron beams 202 is detected, for example, when a difference in the luminance average value exceeds a set threshold, the sensitivity adjustor 142 calculates an adjustment amount of detection sensitivity and corrects the detection sensitivity of the detection pixel. Moreover, since the sensitivity adjustor 142 can instruct the detector 153 to change a signal processing condition in the detector 153, when a next sub-inspection region is inspected, the inspection can be performed under a condition in which the difference in the intensity between the multi-primary electron beams 202 has been corrected, in other words, calibration has been performed again.

After each sub-inspection region is inspected, acquired images are joined together (partially overlapped) to acquire the inspection region image Y. The image corrector 143 may treat the acquired inspection region image Y with arbitrary image processing such as removal of distortion.

Obtained defect information and inspection images are stored in the storage device 131, for example.

Figure 7:
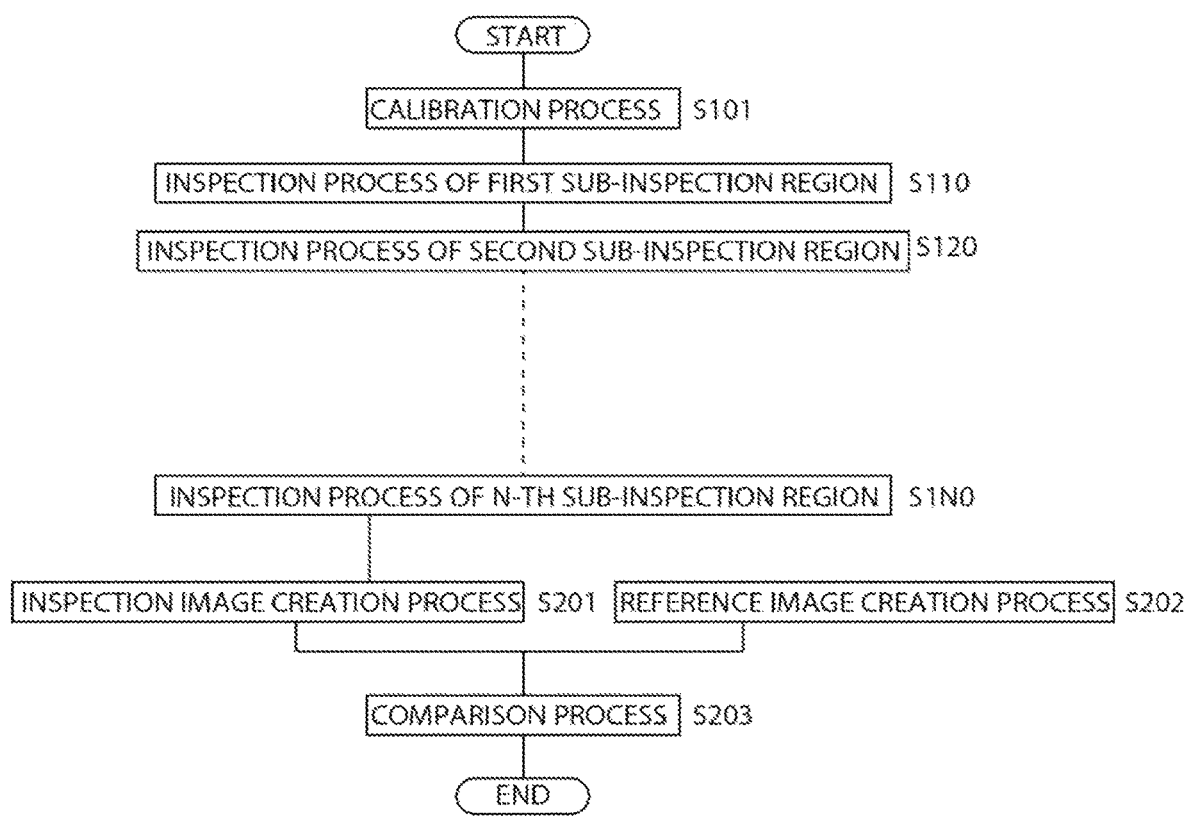
FIG. 7 is a flowchart of a multibeam inspection method according to the first embodiment.

Next, the inspection apparatus 100 will be explained in more detail through an explanation of the inspection method of the multibeam inspection apparatus 100. FIG. 7 shows a flowchart of a multibeam inspection method. An inspection method according to the first embodiment includes a calibration process (S101), inspection processes of sub-inspection regions (S110 to S1N0), an inspection image creation process (S201), a reference image creation process (S202), and a comparison process (S203).

<Calibration Process (S101)>

In the calibration process (S101), the region to be inspected X or a substrate for calibration is inspected by the multi-primary electron beams 202, and the detection sensitivity and the like in the multi-detector 176 is adjusted according to the difference in the intensity of the multi-primary electron beams 202. For example, an analogue signal obtained by the multi-detector 176, a processing condition of the detector 153 that converts this analogue signal into a digital signal for processing, and the like are changed to adjust the detection sensitivity.

<Inspection Processes of Sub-Inspection Regions (S110 to S1N0)>

Figure 8:
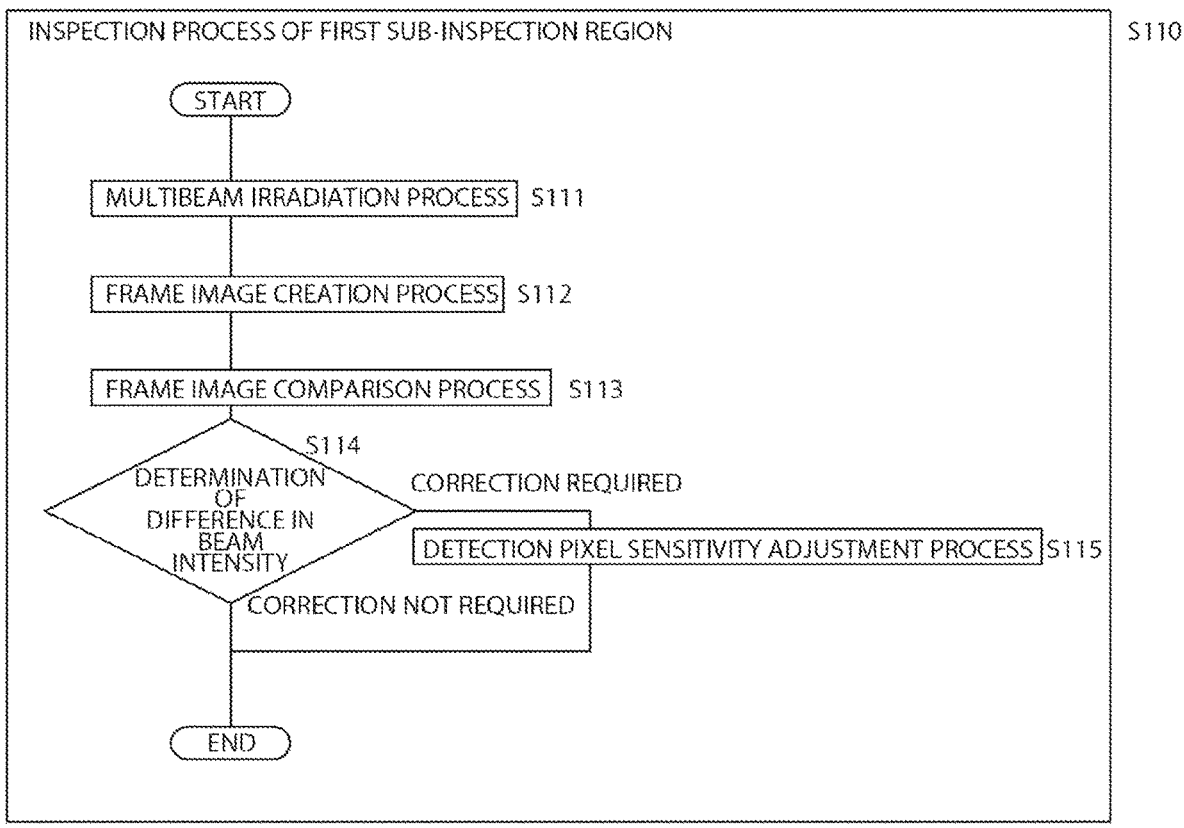
FIG. 8 is a flowchart of the multibeam inspection method according to the first embodiment.

Since a range of the multi-primary electron beams 202 is equal to or less than the inspection range of the region to be inspected X, the region to be inspected X is divided into at least one sub-inspection region, and a plurality of times of inspections from the first to the N-th inspections (N is an integer equal to or more than 1) is performed. An inspection process of a first sub-inspection region (S110) is shown in detail in the flowchart of FIG. 8. The inspection process of a sub-inspection region from the second time (S120 to S1N0) is the same as the inspection process of the first sub-inspection region (S110). The inspection process of the first sub-inspection region (S110) includes a multibeam irradiation process (S111), a frame image creation process (S112), a frame image comparison process (S113), determination of a difference in beam intensity (S114), and a detection pixel sensitivity adjustment process (S115).

<Multibeam Irradiation Process (S111)>

The multibeam irradiation process is a process in which sub-inspection regions of the region to be inspected X are irradiated with the multi-primary electron beams 202 so as to be scanned. A different beam of the primary electron beams 202 is irradiated for each scanning region. The multi-secondary electron beams 203 emitted from the region to be inspected X are led to the multi-detector 176.

<Frame Image Creation Process (S112)>

The frame image creation process (S112) is a process in which a frame image is created from the secondary electron beam 203 that has entered a detection pixel different for each scanning region of the sub-inspection region. For example, the first secondary electron beam 203 emitted from the first scanning region A1 enters the first detection pixel so that an analogue signal is generated. The analogue signal is treated with signal processing in the detector 153 and a digital signal is generated. The generated digital signal is temporarily stored in the pattern memory 154. The digital signal stored in the pattern memory 154 is used for creation of image data (first frame image C1) in the inspection image creation unit 140. The created first frame image C1 is stored in the memory 134, for example. As for other scanning regions, frame images are created in the same manner and stored in the memory 134.

<Frame Image Comparison Process (S113)>

In this process, luminance differences of the overlapping regions (D1 to D12) among the frame images are compared with each other. For example, from a difference between a luminance average (D1-1) of the overlapping region D1 of the first frame image C1 and a luminance average (D1-2) of the overlapping region D1 of the second frame image C2, a change in a difference in intensity between the first primary electron beam 202 after calibration and the second primary electron beam 202 irradiated on the second scanning region A2 can be obtained.

As for other frame image regions, the difference in beam intensity can be obtained in the same manner through comparison of overlapping regions of the frame images. In the frame image comparison process, comparison of gradation values of frame images, frame image histograms, and the like can be performed.

In the embodiment, the comparison process in a unit of sub-inspection region and sub-inspection region image according to the scanning regions of the multibeam is explained. However, in order to completely fill the inspection region image Y, the sub-inspection regions (S110-S1N0) are overlapped with each other so as to prevent inspection omission. Therefore, a relation of the sub-inspection regions and overlapping in the sub-inspection regions overlapping of which has been explained applies to a relation with the adjacent sub-inspection regions. For example, on a right side of A3, there is a portion overlapping with A1 of the next sub-inspection region. Using this, comparison date between beams for A1 and A3 can be obtained. For convenience of explanation, overlapping regions among the sub-inspection regions will be omitted, but information obtained according to this can also be used in the same manner.

<Process of Determination of Difference in Beam Intensity (S114)>

In the process of determination of a difference in beam intensity (S114) is a process in which it is determined whether a difference in beam intensity obtained in the frame image comparison process (S113) is equal to or more than a threshold. This determination can be made in the comparison unit 141. For example, when it is determined that the difference in beam intensity is equal to or more than the threshold, the sensitivity of the detection pixel is adjusted in the detection pixel sensitivity adjustment process (S115). The difference in beam intensity in adjacent overlapping frame image regions is taken into consideration when it is determined whether the difference in beam intensity is equal to or more than the threshold. As a result, for example, when the difference in beam intensity is less than the threshold, the sensitivity of the detection pixel is not adjusted, the inspection process of the first sub-inspection region (S110) ends, and the inspection process of the second sub-inspection region (S120) is performed in the same manner as the inspection process of the first sub-inspection region (S110). When the number of sub-inspection region is N, the inspection process is performed until the inspection process of the N-th sub-inspection region (S1N0).

<Detection Pixel Sensitivity Adjustment Process (S115)>

The detection pixel sensitivity adjustment process (S115) is a process in which when it has been determined that the difference in beam intensity is equal to or more than the threshold in the process of determination of a difference in beam intensity (S114), the detection sensitivity of detection pixels corresponding to the primary electron beams 202 between which there is a difference in beam intensity. First, the difference in beam intensity is obtained in the comparison unit 141, and an adjustment value of the detection sensitivity is obtained in consideration of the difference in beam intensity in the sensitivity adjustor 142. The sensitivity adjustor 142 then makes a correction only for the adjustment value from which the signal processing condition in the detector 153 has been obtained. Through changing of the signal processing condition of the detector 153 for each inspection pixel, when the next sub-inspection region is inspected, a frame image for which the difference in beam intensity during the previous inspection has been corrected can be obtained. This means that since the processing condition for acquiring the frame image in real time is changed, the inspection is performed under a condition in which the change in the beam intensity generated from the beginning of the inspection to the end of the inspection has been corrected. If the signal processing is not performed under an appropriate condition according to the beam intensity, the gradation value of the image may be too high or too low. Such an image whose gradation value is inappropriate as described above cannot be easily corrected to be an image appropriate for defect detection and the like even after being treated with the image processing. In the embodiment, a correction is made in real time even when a change occurs in the beam intensity. Therefore, an image more appropriate for defect inspection and the like can be acquired.

<Inspection Image Creation Process (S201)>

The inspection image creation process (S201) is a process in which the inspection region image Y is created through overlapping and joining of the frame images acquired through an inspection of the sub-inspection regions, the sub-inspection region images, or the frame images and the sub-inspection region images. The processing of overlapping and joining of the images is performed in consideration of positional deviation. In the inspection image creation process (S201), processing and the like are performed in the inspection image creation unit 140. The inspection region image Y is stored in the memory 134 and/or the storage device 131.

<Reference Image Creation Process (S202)

The reference image creation process (S202) is a process in which a reference image to be compared with the inspection region image Y is created. Processing and the like for reference image creation are performed in the reference image creation unit 144. When a so-called die to die inspection is performed, an adjacent inspection image of an identical pattern portion is used as a reference image. Moreover, when a so-called die to database inspection is performed, a reference image is created from a design pattern, for example. The reference image is stored in the memory 134 and/or the storage device 131.

Note that although omitted in the embodiment, the reference image when a die to die inspection is performed is also acquired in the same process as the inspection image generation described above.

<Comparison Process (S203)>

The comparison process (S203) is a process in which the inspection region image Y is compared with the reference image so as to detect a defect. In the comparison process (S203), processing and the like are performed in the comparison unit 141. A defect detection parameter is used to detect a defect from a difference between the inspection region image Y and the reference image. Detected defect information is stored in the storage device 131.

According to the inspection method of the embodiment, the difference in beam intensity can be obtained in real time during the inspection, and an inspection image can be acquired under a condition considering the difference in beam intensity.

Second Embodiment

A second embodiment is a modified example of the first embodiment. In the second embodiment, in the comparison unit 141, for example, in a frame image comparison process (S113) for comparison among the first frame image C1, the second frame image C2, and the reference image, and a defect detection process (S116), defect detection result information of each of the frame images in the overlapping region D1 is obtained, and this defect information is used to adjust the defect detection parameter. This means that the second embodiment is different from the first embodiment in that at the time of a defect inspection of the sub-inspection region, a difference in defect information of the overlapping region of each frame is used to adjust the defect detection parameter.

In the comparison unit 141, the overlapping frame image region of the frame image is compared with the reference image. For example, in a case where when the first overlapping frame image region D1 of the first frame image is compared with the reference image, a defect is detected, and when the first overlapping frame image region D1 of the second frame image C2 is compared with the reference image, no defect is detected, the defect detection parameter is adjusted. When it cannot be determined that defect detection of either the first frame image C1 or the second frame image C2 cannot be normally performed, for example, it is preferred that the third frame image C3 partially overlapping with the second frame image C2 in the second overlapping frame image region D2 is compared with the second frame image C2. When defect detection is performed in the second overlapping frame image region D2 by this comparison, determination of whether or not the defect of the second frame image C2 has been correctly detected is highly reliable. When a comparison of other overlapping frame image regions is performed a plurality of times, the defect detection parameter can be highly accurate.

The comparison unit 141 inspects the first sub-inspection region, for example, and based on the difference in beam intensity, for example, adjusts the detection sensitivity of the first detection pixel and/or the second detection pixel. Moreover, the comparison unit 141 adjusts the defect detection parameter from the inspection of the first sub-inspection region, inspects a second sub-inspection region, and compares a frame image created by the first detection pixel whose detection sensitivity has been adjusted and the secondary electron beam that has entered the second detection pixel with the reference image so as to obtain the adjusted defect detection parameter. The comparison unit 141 can detect a defect of the region to be inspected X using this adjusted defect detection parameter, and further adjust the defect detection parameter.

Figure 9:
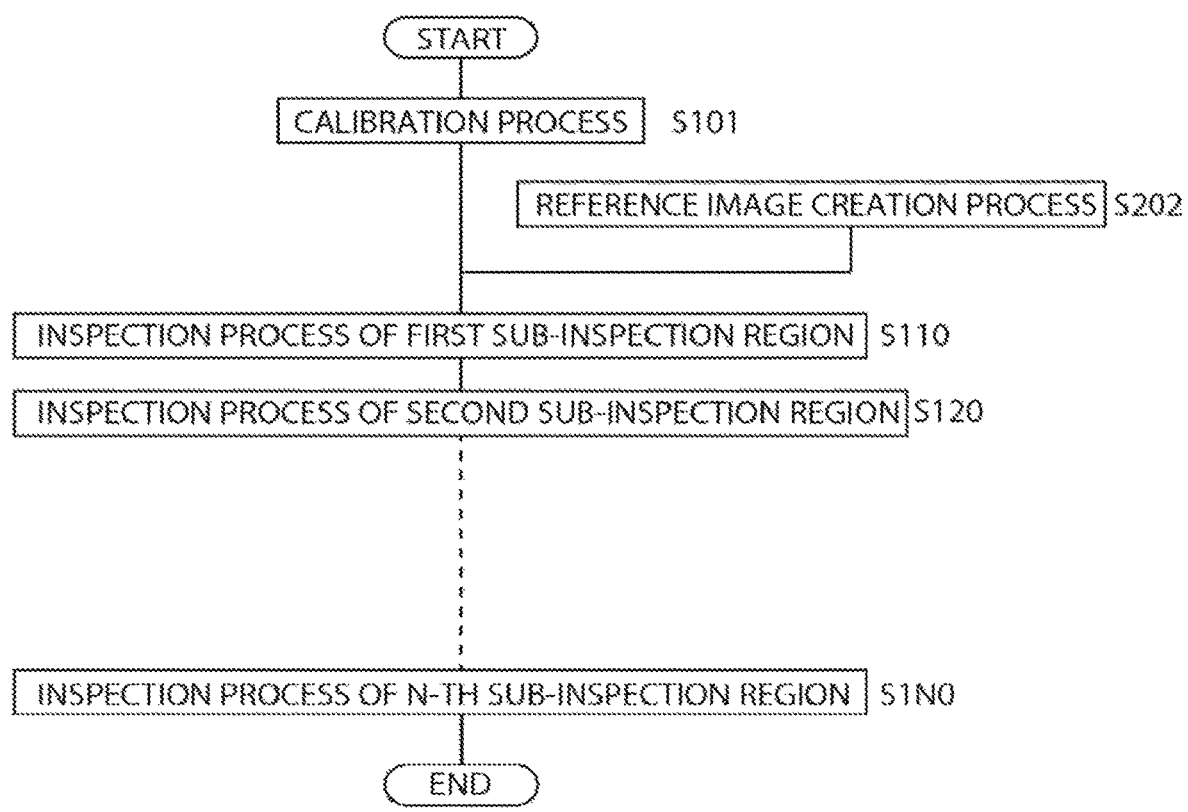
FIG. 9 is a flowchart of a multibeam inspection method according to a second embodiment.

FIG. 9 shows a flowchart of the second embodiment. An inspection method according to the second embodiment includes a calibration process (S101), inspection processes of sub-inspection regions (S110 to S1N0), and a reference image creation process (S202). In the first embodiment, the reference image creation process (S202) is performed before the comparison process (S203). However, in the second embodiment, processing and the like of the reference image creation process (S202) are performed before the inspection process of the first sub-inspection region (S110).

Figure 10:
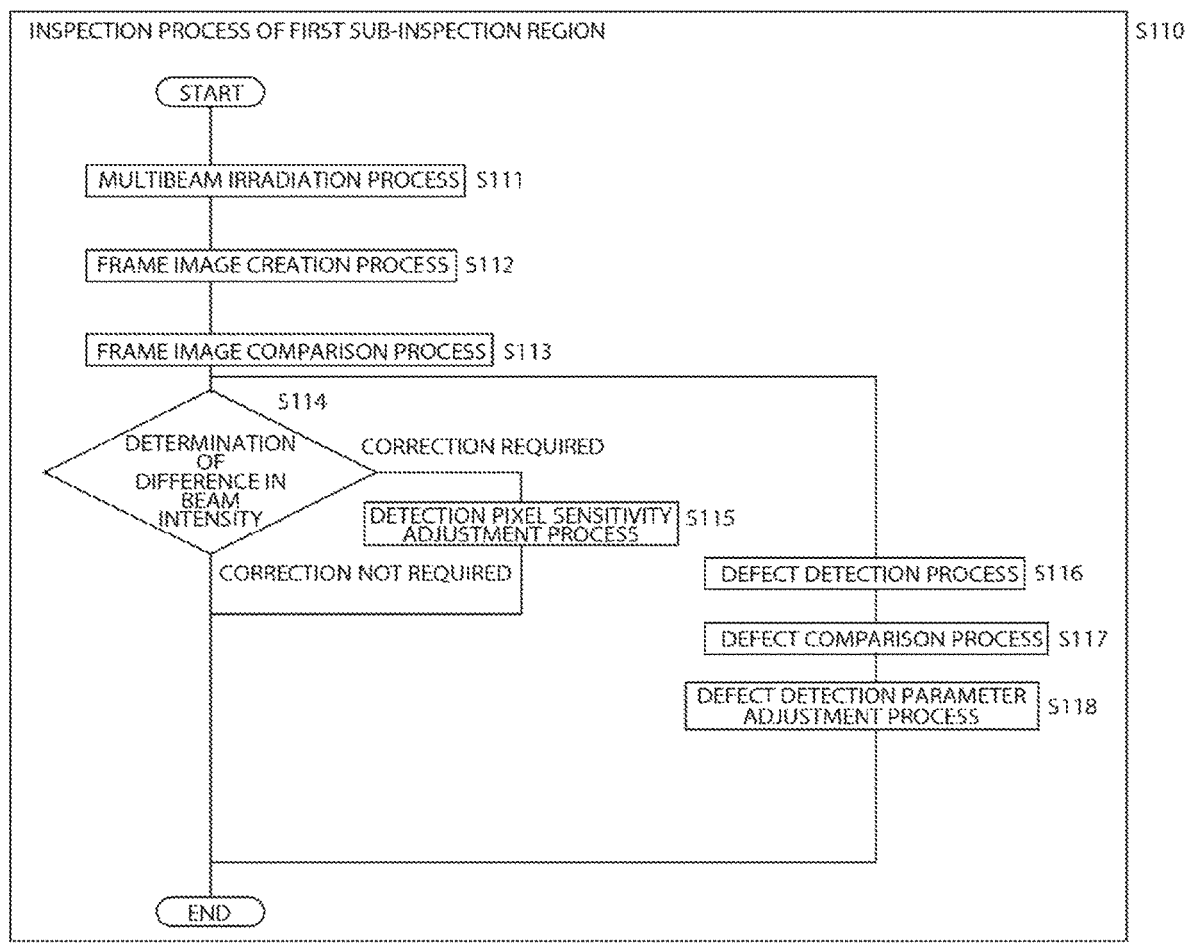
FIG. 10 is a flowchart of the multibeam inspection method according to the second embodiment.

FIG. 10 shows a flowchart of the inspection process of the first sub-inspection region according to the second embodiment. Note that in the same manner as the first embodiment, the flowchart shown in FIG. 10 is applicable to inspection processes of other sub-inspection regions. Processes other than the inspection processes of sub-inspection regions (S110 to S1N0) are common to the first embodiment and the second embodiment. Explanations of common processes will be omitted.

<Inspection Processes of Sub-Inspection Regions (S110 to S1N0)>

The inspection process of the first sub-inspection region (S110) of the second embodiment includes a multibeam irradiation process (S111), a frame image creation process (S112), the frame image comparison process (S113), determination of a difference in beam intensity (S114), a detection pixel sensitivity adjustment process (S115), the defect detection process (S116), a defect comparison process (S117), and a defect detection parameter adjustment process (S118). Processes other than the defect detection process (S116), the defect comparison process (S117), and the defect detection parameter adjustment process (S118) are common to the first embodiment and the second embodiment. Explanations of common processes will be omitted. Note that the defect detection process (S116), the defect comparison process (S117), and the defect detection parameter adjustment process (S118) may be performed in the inspection processes of all the sub-inspection regions, or may be performed in the inspection processes of some sub-inspection regions. The defect detection process (S116), the defect comparison process (S117), and the defect detection parameter adjustment process (S118) are a group of processes, and these processes are continuously processed. Processing and the like of the processes of the group may be performed concurrently with the process of determination of a difference in beam intensity (S114), or the processing and the like may be performed either before or after the process of determination of a difference in beam intensity (S114).

<Defect Detection Process (S116)>

In this process, frame images acquired in the inspection processes of the first to the N-th sub-inspection regions (S110 to S1N0) are compared with the reference image so as to perform defect detection of the frame images in the same manner as the comparison process (S203).

<Defect Comparison Process (S117)>

The defect comparison process (S117) is a process in which, in frame images having a common overlapping region in the defect detection process (S116), defect information of each of the frame images is compared, and a combination of one frame image in which a defect has been detected and another frame image in which no defect has been detected is extracted. In the defect comparison process (S117), processing and the like are performed in the comparison unit 141. When frame images, one of which has a detected defect and another of which has no detected defect, have been found, it is further determined whether a part that is not actually a defect has been detected as a defect in the one of the frame images, and whether no defect has been detected in the other one of the frame images although there has been a defect. The adjustment of the defect detection parameter includes an adjustment of defect detection algorithm.

Even when a defect is detected in the same position of the overlapping region in both of the adjacent frame images, if there is a difference in the defect information due to a defect detection method such as defect intensity and a defect size, the difference can be used for adjustment of the defect detection parameter as with defect presence/absence information.

<Defect Detection Parameter Adjustment Process (S118)>

The defect detection parameter adjustment process (S118) is a process in which the defect detection parameter is adjusted from the defect information of the overlapping frame image region of the combination of the frame images extracted in the defect comparison process (S117). In the defect detection parameter adjustment process (S118), processing and the like are performed in the comparison unit 141. For example, when a part that is not actually a defect has been detected as a defect (false defect) in one of the frame images, the defect detection parameter is adjusted so as not to defect the part, which has been detected as the defect, as a defect. Moreover, for example, the defect detection parameter is adjusted so as to defect a part that has not been detected as a defect in the other one of the frame images although there has been a defect.

According to the inspection method of the embodiment, the defect detection parameter is adjusted in the inspection processes of sub-inspection regions (S110 to S1N0), and thus the accuracy of the final defect detection can be enhanced.

Third Embodiment

A third embodiment is a modified example of the first embodiment. The third embodiment is different from the first embodiment in that at least one kind of image selected from a group including a frame image, a sub-inspection region image, and an inspection image is corrected in the image corrector 143. For example, using an image correction parameter obtained from a difference in beam intensity, a gradation value of the first frame image C1 and/or a gradation value of the second frame image C2 is corrected in the image corrector 143. In the image corrector 143, an image is corrected with an algorithm considering the difference in beam intensity. Settings of the detector 153 are adjusted according the difference in beam intensity in real time. However, an image for which the difference in beam intensity has been obtained is an image that has been inspected under a condition not considering the difference in beam intensity. Therefore, the image correction parameter is obtained from the obtained difference in beam intensity, and the image is corrected so as to eliminate (decrease) an influence of the difference in beam intensity. Any of a frame image, a sub-inspection region image formed of joined frame images, and the inspection region image Y formed of joined sub-inspection region images can be corrected. Images obtained through adjustment of the detector so as to compensate changes with time in the difference in beam intensity do not have such a large difference in beam intensity. Accordingly, when the obtained images are slightly corrected, a correction can be made so as to eliminate (decrease) an influence of the difference in beam intensity. Therefore, in the point of view of post-processing of the images, the inspection apparatus of the embodiment is suitable.

Figure 11:
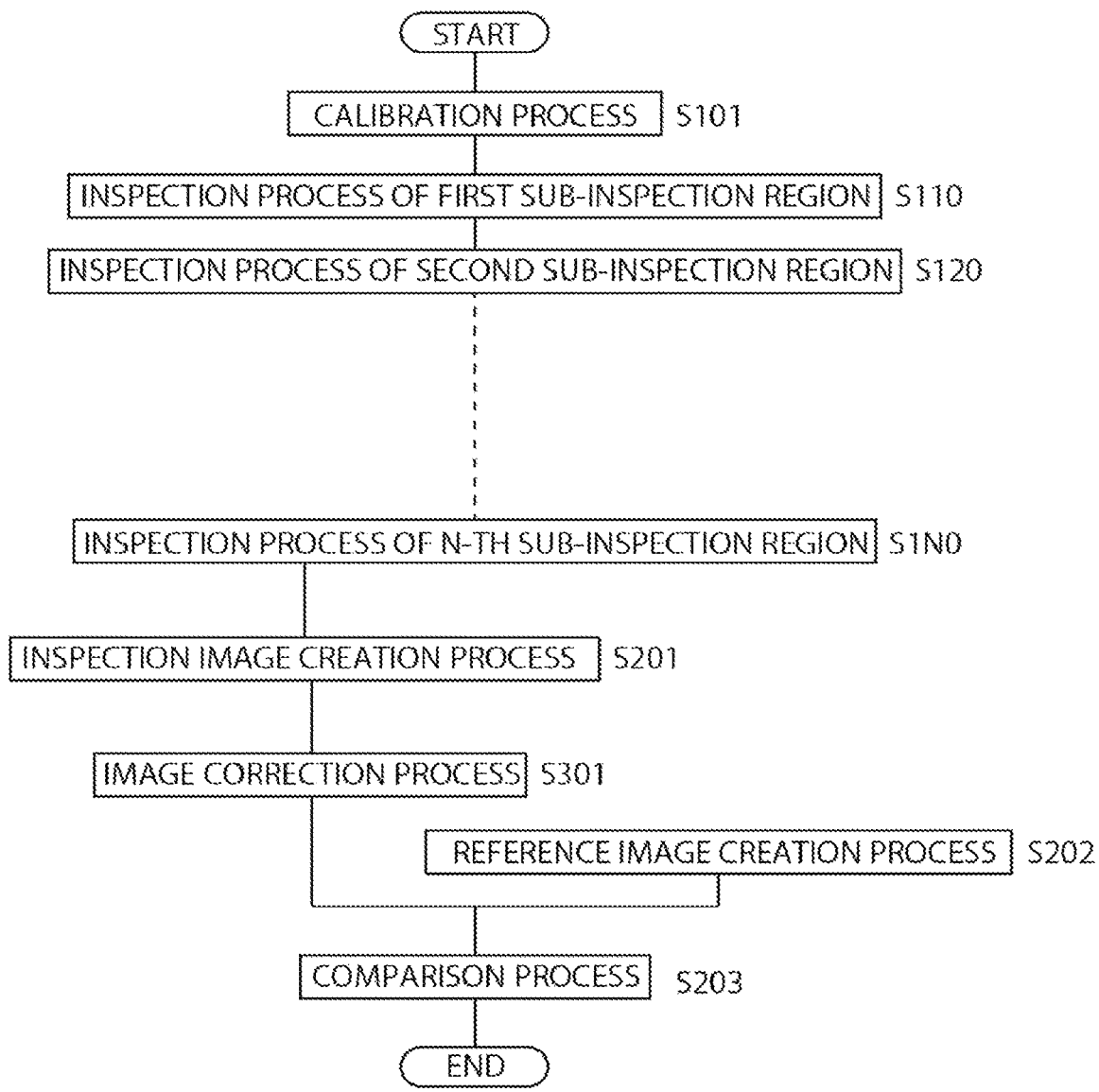
FIG. 11 is a flowchart of a multibeam inspection method according to a third embodiment.

FIG. 11 shows a flowchart of the third embodiment. An inspection method according to the third embodiment includes a calibration process (S101), inspection processes of sub-inspection regions (S110 to S1N0), an inspection image creation process (S201), a reference image creation process (S202), a comparison process (S203), and an image correction process (S301). In the third embodiment, a process is performed in which at least one kind of image selected from a group including a frame image, a sub-inspection region image, and the inspection region image Y is corrected. Processes other than the image correction process (S301) are common to the first embodiment. Explanations of common processes will be omitted.

<Image Correction Process (S301)>

The image correction process (S301) is a process in which at least one kind of image selected from a group including a frame image, a sub-inspection region image, and the inspection region image Y is corrected based on information of the difference in beam intensity. In the image correction process (S301), processing and the like are performed in the image corrector 143. According to an image to be corrected, order of performing the processing and the like of the image correction process (S301) can be arbitrarily changed. It is preferred that the image correction process (S301) is performed before the comparison process (S203) in which defect detection is performed so that the image has been corrected when defect detection is performed, and thus the accuracy of defect detection is enhanced.

When a frame image is corrected, for example, the processing and the like of the image correction process (S301) can be performed in the inspection process of each sub-inspection region. When a sub-inspection region image is corrected, the processing and the like of the image correction process (S301) can be performed after the sub-inspection region image formed of overlapped and joined frame images is acquired. When the inspection region image Y is corrected, the processing and the like of the image correction process (S301) can be performed between the inspection image creation process (S201) and the comparison process (S203). In any case, frame images can be substantially corrected.

Figure 12:
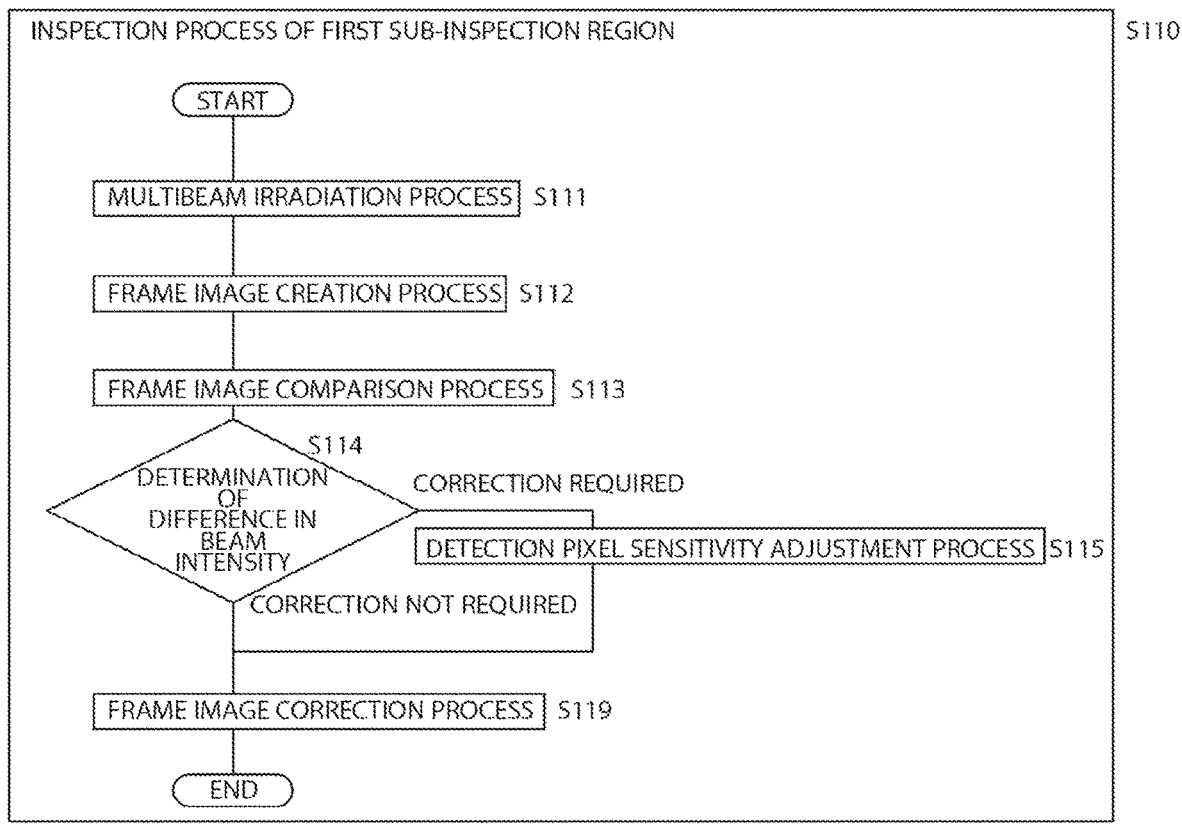
FIG. 12 is a flowchart of the multibeam inspection method according to the third embodiment.

FIG. 12 shows a flowchart of an inspection process of a first sub-inspection region according to the third embodiment. Note that in the same manner as the first embodiment, the flowchart shown in FIG. 12 is applicable to inspection processes of other sub-inspection regions (S120 to S1N0). Processes other than the inspection processes of sub-inspection regions (S110 to S1N0) are common to the first embodiment and the second embodiment. Explanations of common processes will be omitted.

In the image correction process (S301) whose processing is performed in the inspection process of a sub-inspection region, for example, when a gradation value of the third overlapping frame image region D3 of the first frame image C1 is higher than that of the third overlapping frame image region D3 of the fourth frame image C4, the gradation value of the image of the first frame image C1 is lowered or the gradation value of the fourth frame image C4 is increased using a correction algorism based on the difference in beam intensity.

Fourth Embodiment

In a fourth embodiment, a correction value corresponding to a difference in beam intensity is obtained from an overlapping portion of acquired frame images, and the correction value is applied to a gradation value of the image in each frame image to detect a defect. Even when detection sensitivity is not adjusted based on the difference in beam intensity, defect detection considering the difference in beam intensity can be performed. Processing of defect detection of the fourth embodiment can be adopted to the inspection apparatus (method) of the first to the third embodiments.

In the first embodiment, in the frame image comparison process (S113), the difference in beam intensity is obtained from a difference of luminance averages of an overlapping region D of two frame images C, and the detection sensitivity is adjusted from the difference in beam intensity. In the fourth embodiment, in the same manner as the first embodiment, a difference in beam intensity (offset) is obtained from an overlapping region of frame images. Then, a luminance offset, which is a difference in luminance resulting from the difference in beam intensity in the overlapping region, is obtained. Using the luminance offset, defect detection is performed with a correction sensitivity parameter obtained through correction of a threshold of defect detection. Through performing of defect detection using the correction sensitivity parameter, highly reliable defect detection can be performed even when a change occurs in the beam intensity. Hereinafter, defect detection considering the difference in beam intensity will be explained using an example of the first frame image C1 and the second frame image C2.

When the average luminance of the overlapping region D1 of the first frame image C1 is $F_{C1}$ and the average luminance of the overlapping region D1 of the second frame image C2 is $F_{C2}$, $\Delta F_{C1C2}$ ($=F_{C2}-F_{C1}$), which is a luminance offset of the first frame image C1 and the second frame image C2, is obtained.

Figure 13:
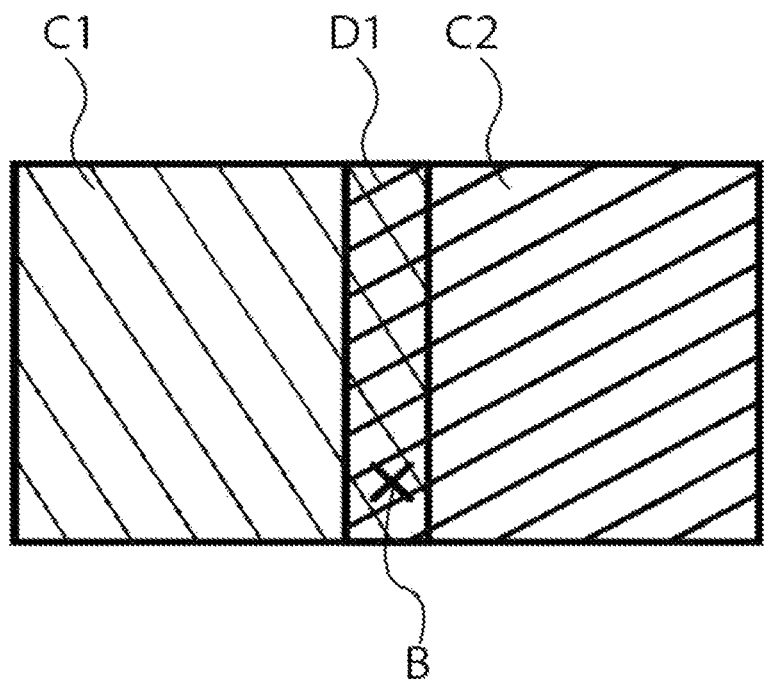
FIG. 13 is a schematic view of the pixel B, which is common to the first frame image C1 and the second frame image C2 according to a fourth embodiment.

When a pixel B, which is common to the first frame image C1 and the second frame image C2, is a defect candidate, defect detection of the defect candidate is performed. FIG. 13 shows schematically the pixel B, which is common to the first frame image C1 and the second frame image C2. First, a luminance $aF_{ref}$ of the pixel B of a reference image, a luminance $aF_{C1}$ of the pixel B of the first frame image C1, and a luminance $aF_{C2}$ of the pixel B of the second frame image C2 are obtained. Then, E1 ($=aF_{ref}-aF_{C1}$), which is a luminance difference of a defect candidate of the first frame image C1, and E2 ($=aF_{ref}-aF_{C2}$), which is a luminance difference of a defect candidate of the second frame image C2, are obtained. The luminance differences E1 and E2, and the luminance offset $\Delta F_{C1C2}$ satisfy a relation of $E2=E1+\Delta F_{C1C2}$.

In a case where a defect is determined when the luminance difference is larger than a threshold Th of defect detection, if an evaluation is made without considering the luminance offset, defect detection is affected when the luminance offset $\Delta F_{C1C2}$ is large, for example. For example, when the luminance offset $\Delta F_{C1C2}$ is a positive value, in other words, when the luminance of the overlapping region D1 of the second frame image C2 is higher than the luminance of the overlapping region D1 of the first frame image C1, a relation of $E1<Th<E2$ may be satisfied. In this case, if the difference in beam intensity is not taken into consideration, it is determined that the first frame image C1 has no defect and the second frame image C2 has a defect. In the fourth embodiment, during the defect detection of the second frame image C2, determination is made using Thn (=Th+$\Delta F_{C1C2}$), which is a correction sensitivity parameter obtained through correction of the threshold Th by the luminance offset $\Delta F_{C1C2}$. When the correction sensitivity parameter Thn is compared with the luminance difference E2 of the second frame image C2, E2<Thn is satisfied, and it is determined that the second frame image C2 has no defect as with the first frame image C1. When the luminance offset $\Delta F_{C1C2}$ is a negative value, in other words, when the luminance of the overlapping region D1 of the second frame image C2 is lower than the luminance of the overlapping region D1 of the first frame image C1, the luminance difference E1 of the first frame image C1 is compared with the correction sensitivity parameter Thn (=Th+$\Delta F_{C1C2}$) obtained through correction of the threshold Th by the luminance offset $\Delta F_{C1C2}$ to perform defect detection.

When the luminance offset $\Delta F_{C1C2}$ is caused by the difference in beam intensity, defect detection is performed considering the luminance offset $\Delta F_{C1C2}$ so as to perform highly reliable defect detection considering the difference in beam intensity. In frame images other than the overlapping region D1, highly reliable defect detection can be performed considering the luminance offset $\Delta F_{C1C2}$.

In the first embodiment, since the processing condition of the detector 153 is adjusted based on the difference in beam intensity when the next sub-inspection region is inspected, the detected difference in beam intensity corresponds to changes in the beam intensity with time. In the third embodiment, since an inspection image in which the beam intensity has changed is corrected based on the difference in beam intensity, the accuracy of defect detection is further enhanced.

Each "unit" described above includes hardware, software, and a combination of hardware and software.

The embodiments have been explained above with reference to specific examples. The embodiments described above are merely examples, and are not limited. In addition, constituent elements of each embodiment may be combined as appropriate.

Although in the embodiments, descriptions of parts and the like not directly required for the explanation of the present invention such as the configuration of the multibeam inspection apparatus, the manufacturing method thereof, and the multibeam inspection method are omitted, the required configurations of the multibeam inspection apparatus and the multibeam inspection method may be appropriately selected and used. All other multibeam inspection apparatuses and multibeam inspection methods that include elements of the present invention and can be appropriately designed or changed by those skilled in the art are within the scope of the present invention. The scope of the present invention is defined by the scope of the claims and the scope of the equivalents thereof.

What is claimed is:

1. A multibeam inspection apparatus comprising:
a stage on which an object to be inspected is capable to be mounted, a multibeam column that irradiates the object to be inspected with multi-primary electron beams, and a multi-detector including a first detection pixel that receives irradiation of a first secondary electron beam emitted after a first beam scanning region of the object to be inspected is irradiated with a first primary electron beam of the multi-primary electron beams and a second detection pixel that receives irradiation of a second secondary electron beam emitted after a second beam scanning region adjacent to the first beam scanning region of the object to be inspected and overlapping with the first beam scanning region is irradiated with a second primary electron beam adjacent to the first primary electron beam of the multi-primary electron beams;
a comparison unit that obtains a difference in beam intensity between the first primary electron beam and the second primary electron beam by comparing overlapping portions of a first frame image acquired through entering of the first secondary electron beam into the first detection pixel and a second frame image acquired through entering of the second secondary electron beam into the second detection pixel; and
a sensitivity adjustor that adjusts detection sensitivity of the first detection pixel and/or the second detection pixel so as to correct the difference in beam intensity,
wherein the comparison unit compares an overlapping frame image region in which the first frame image and the second frame image overlap with each other with a reference image to detect a defect of the object to be inspected and obtain defect information, and adjusts a defect detection parameter using the defect information.

2. The multibeam inspection apparatus according to claim 1, further comprising:
an image corrector that corrects a gradation value of the first frame image and/or a gradation value of the second frame image using a correction value obtained from the difference in beam intensity.

3. The multibeam inspection apparatus according to claim 1, wherein
the comparison unit that detects a defect of the object to be inspected by comparing an image formed of the first frame image and the second frame image overlapped with each other and joined together with a reference image.

4. The multibeam inspection apparatus according to claim 1, wherein
the comparison unit detects a defect of the object to be inspected by comparing an image formed of joined frame images that have been created from secondary electron beams that have entered the first detection pixel and the second detection pixel for which the detection sensitivity has been adjusted with a reference image, and using the defect detection parameter that has been adjusted.

5. The multibeam inspection apparatus according to claim 2, wherein
the comparison unit detects a defect of the object to be inspected using an image that has been corrected in the image corrector.

6. The multibeam inspection apparatus according to claim 1, wherein
an inspection image is acquired through scanning of the first beam scanning region and the second beam scanning region of the object to be inspected by the multi-detector for which the detection sensitivity has been adjusted.

7. A multibeam inspection apparatus comprising:
a stage on which an object to be inspected is capable to be mounted, a multibeam column that irradiates the object to be inspected with multi-primary electron beams, and a multi-detector including a first detection pixel that receives irradiation of a first secondary electron beam emitted after a first beam scanning region of the object to be inspected is irradiated with a first primary electron beam of the multi-primary electron beams and a second detection pixel that receives irradiation of a second secondary electron beam emitted after a second beam scanning region adjacent to the first beam scanning region of the object to be inspected and overlapping with the first beam scanning region is irradiated with a second primary electron beam adjacent to the first primary electron beam of the multi-primary electron beams;

a comparison unit that obtains a difference in beam intensity between the first primary electron beam and the second primary electron beam by comparing overlapping portions of a first frame image acquired through entering of the first secondary electron beam into the first detection pixel and a second frame image acquired through entering of the second secondary electron beam into the second detection pixel;

a sensitivity adjustor that adjusts detection sensitivity of the first detection pixel and/or the second detection pixel so as to correct the difference in beam intensity; and an image corrector that corrects a gradation value of the first frame image and/or a gradation value of the second frame image using a correction value obtained from the difference in beam intensity.

8. The multibeam inspection apparatus according to claim 7, wherein the comparison unit that detects a defect of the object to be inspected by comparing an image formed of the first frame image and the second frame image overlapped with each other and joined together with a reference image.

9. The multibeam inspection apparatus according to claim 7, wherein the comparison unit detects a defect of the object to be inspected using an image that has been corrected in the image corrector.

10. The multibeam inspection apparatus according to claim 7, wherein an inspection image is acquired through scanning of the first beam scanning region and the second beam scanning region of the object to be inspected by the multi-detector for which the detection sensitivity has been adjusted.

* * * * *